US008847158B2

(12) United States Patent
Suhara et al.

(10) Patent No.: US 8,847,158 B2
(45) Date of Patent: Sep. 30, 2014

(54) DEVICE AND METHOD FOR MEASURING SURFACE CHARGE DISTRIBUTION

(75) Inventors: Hiroyuki Suhara, Yokohama (JP); Hiroaki Tanaka, Kawasaki (JP); Hidekazu Murata, Nagoya (JP); Hiroshi Shimoyama, Kasugai (JP)

(73) Assignees: Ricoh Company, Ltd., Tokyo (JP); Meijo University, Nagoya-shi (JP)

( * ) Notice: Subject to any disclaimer, the term of this patent is extended or adjusted under 35 U.S.C. 154(b) by 615 days.

(21) Appl. No.: 13/224,873

(22) Filed: Sep. 2, 2011

(65) Prior Publication Data

US 2012/0059612 A1 Mar. 8, 2012

(30) Foreign Application Priority Data

Sep. 6, 2010 (JP) ................................ 2010-199367

(51) Int. Cl.
*H01J 37/00* (2006.01)
*G03G 15/00* (2006.01)

(52) U.S. Cl.
CPC .................................. *G03G 15/5037* (2013.01)
USPC ............ 250/305; 250/306; 250/307; 250/310

(58) Field of Classification Search
CPC ................. H01J 2237/2594; H01J 2237/0048; H01J 2237/2464; G01R 29/14
USPC .......................................... 250/305–308, 310
See application file for complete search history.

(56) References Cited

U.S. PATENT DOCUMENTS

| | | | |
|---|---|---|---|
| 5,834,766 | A | 11/1998 | Suhara |
| 6,081,386 | A | 6/2000 | Hayashi et al. |
| 6,376,837 | B1 | 4/2002 | Itabashi et al. |
| 6,400,391 | B1 | 6/2002 | Suhara et al. |
| 6,532,094 | B2 | 3/2003 | Suhara |
| 6,555,810 | B1 | 4/2003 | Suhara |
| 6,891,678 | B2 | 5/2005 | Suhara |
| 6,999,208 | B2 | 2/2006 | Suzuki et al. |
| 7,239,148 | B2 | 7/2007 | Suhara |
| 7,400,839 | B2 | 7/2008 | Suhara |
| 7,403,316 | B2 | 7/2008 | Amada |
| 7,612,570 | B2 | 11/2009 | Suhara |
| 7,783,213 | B2 | 8/2010 | Suhara |
| 7,869,725 | B2 | 1/2011 | Suhara |
| 2008/0088316 | A1 | 4/2008 | Suhara |

(Continued)

FOREIGN PATENT DOCUMENTS

| | | |
|---|---|---|
| JP | 59-842 | 1/1984 |
| JP | 63-41186 | 2/1988 |

(Continued)

*Primary Examiner* — Michael Maskell
(74) *Attorney, Agent, or Firm* — Oblon, Spivak, McClelland, Maier & Neustadt, L.L.P.

(57) ABSTRACT

A surface charge measuring distribution method includes the steps of irradiating a sample with a charged particle beam and charging a sample surface in a spot-like manner, irradiating the charged sample with the charged particle beam to measure a potential at a potential saddle point formed above the sample, selecting one of preset multiple structure models and a tentative space charge distribution associated with the selected structure model, calculating a space potential at the potential saddle point by electromagnetic field analysis using the selected structure model and tentative space charge distribution, comparing the calculated space potential and measured value to determine the tentative space charge distribution as a space charge distribution of the sample when an error between the space potential and the measured value is within a predetermined range, and calculating a surface charge distribution of the sample by electromagnetic field analysis based on the determined space charge distribution.

13 Claims, 30 Drawing Sheets

(56) References Cited

U.S. PATENT DOCUMENTS

| | | | |
|---|---|---|---|
| 2009/0051982 | A1 | 2/2009 | Suhara |
| 2009/0220256 | A1 | 9/2009 | Suhara et al. |
| 2009/0302218 | A1 | 12/2009 | Suhara |
| 2010/0196052 | A1 | 8/2010 | Suhara |

FOREIGN PATENT DOCUMENTS

| | | | | |
|---|---|---|---|---|
| JP | 3-49143 | 3/1991 | | |
| JP | 3-200100 | 9/1991 | | |
| JP | 3-261057 | 11/1991 | | |
| JP | 10-334844 | 12/1998 | | |
| JP | 2003-295696 | 10/2003 | | |
| JP | 2004-251800 | 9/2004 | | |
| JP | 2005-166542 | 6/2005 | | |
| JP | 2006-344436 | * 12/2006 | ............. | H01J 37/28 |
| JP | 2008-76100 | 4/2008 | | |
| JP | 2011-58841 | 3/2011 | | |

* cited by examiner

INCIDENT ELECTRON ORBIT (SAMPLE SURFACE: -1,000V)

SPACE POTENTIAL CONTOUR

SURFACE POTENTIAL

SPACE POTENTIAL DISTRIBUTION IN SAMPLE HORIZONTAL DIRECTION (ALONG CROSS SECTION X)

SPACE POTENTIAL DISTRIBUTION IN SAMPLE VERTICAL DIRECTION (ALONG CROSS SECTION Z)

$$A_{ji} = \frac{1}{4\pi\varepsilon_0} \iint_{\Delta S_i} \frac{1}{|R-R_j|} dS \quad (1 \leq i \leq n,\ 1 \leq j \leq m)$$

$$B_{ji} = \frac{\varepsilon_2 - \varepsilon_1}{4\pi\varepsilon_0} \iint_{\Delta S_i} \frac{\partial}{\partial n_j} \left( \frac{1}{|R-R_j|} \right) dS + \frac{\varepsilon_1 + \varepsilon_2}{2\varepsilon_0} \delta_{ji} \quad (1 \leq i \leq n,\ m+1 \leq j \leq n)$$

RELATION BETWEEN ACCELERATED VOLTAGE AND CHARGE

RELATION BETWEEN ACCELERATED VOLTAGE AND CHARGE POTENTIAL

DEVICE AND METHOD FOR MEASURING SURFACE CHARGE DISTRIBUTION

CROSS REFERENCE TO RELATED APPLICATION

The present application is based on and claims priority from Japanese Patent Application No. 2010-199367, filed on Sep. 6, 2010, the disclosure of which is hereby incorporated by reference in its entirety.

BACKGROUND OF THE INVENTION

1. Field of the Invention

The present invention relates to a method and a device for measuring the charge distribution on the surface of a photoreceptor with high resolution in the order of micron, and particularly for measuring an electric latent image formed on an electrophotographic photoreceptor under the same condition as that of an electrophotographic process.

2. Description of the Prior Art

It is known that strictly speaking, electric charges are spatially dispersed in the sample. Herein, surface charge refers to a charge distribution in which charges are more largely distributed on the surface than in a thickness direction. Also, electric charge refers to not only electrons but also ions. Further, the surface charge can be a potential distribution occurring on the sample surface or in the vicinity thereof by applying a voltage to a conductive portion on the sample surface.

Japanese Patent Application Publication No. 3-49143 discloses a method for observing an electric latent image using an electron beam, for example. However, it limits the sample to ones such as an LSI chip on which electric latent images can be stored or retained. That is, it cannot measure a general electrophotographic photoreceptor where dark decay occurs. General dielectrics can semi-permanently hold electric charges so that a charge distribution can be measured with a sufficient amount of time taken after formation of the charge distribution.

However, since the electrophotographic photoreceptor used in an imaging device does not have an infinite resistance, it cannot hold electric charges over a long period of time so that the surface potential thereof decreases over time due to dark decay. The length of time for which the photoreceptor can hold the electric charges is several ten seconds at most even in a darkroom.

Therefore, it is not possible to observe the electric latent image after charging and exposure with a scanning electron microscope (SEM) because it disappears during a preparation for the observation. An X-ray microscope disclosed in Japanese Patent Application Publication No. 3-20010, for example, uses light with a wavelength very different from that for an electrophotographic photoreceptor in four digits or more and cannot generate arbitrary line patterns and latent images of a desired beam size and beam profile.

Japanese Patent Application Publication No. 2003-295696 and No. 2004-251800, for example, disclose a method and a device for measuring a latent image on a photoreceptor in which dark decay occurs in the following manner. A field distribution is formed in a space over the surface of a sample in accordance with the charge distribution on the sample surface. Secondary electrons generated from incident electrons are pushed back by this electric field so that less amount of the electrons can reach a detector. This makes contrast of brightness on the photoreceptor depending on electric field intensity and a high contrast image is detectable. With an exposure, an electric latent image with an exposed portion in black and a non-exposed portion in white is formed and can be measured.

Moreover, Japanese Patent Application Publication No. 2005-166542 discloses a method for measuring a latent image profile under a condition that there is a region in which the vertical velocity vector of an incident charged particle relative to the sample is inverted, for example. By this method, the latent image profile can be visualized in the order of micron. However, unlike a general SEM, the orbit of an incident electron varies due to a change in the space field caused by surface charge, so that the varying orbit needs to be corrected in order to accurately measure the profile.

Moreover, Japanese Patent Application Publication No. 10-334844, No. 03-261057, and No. 59-000842, for example, disclose a method for estimating in advance how an applied voltage affects the sample to change an optical deflecting condition. However, this method has a disadvantage that for samples to be measured being charged or having potential distribution, the curve of the orbit of an incident electron is unknown so that the influence of the applied voltage on the sample cannot be estimated.

Furthermore, Japanese Patent Application Publication No. 2006-344436 and No. 2008-76100 for example disclose a method and a device for accurately measuring the surface potential distribution of an object by calculating an electron orbit. In this electron orbit calculation, a structure model and a three-dimensional space are segmented into small cells of a finite size and subjected to Laplace transformation under a potential boundary condition to transform a surface charge into a potential, calculate a space potential and a space field from the space potential and find the electron orbit.

However, it has a problem that the space potential and space field calculation is low in accuracy. The field of an arbitrary point in a space is used in the calculation of the electron orbit so that the calculation accuracy of the electron orbit depends on the field calculation accuracy.

To segment a finite size area into small cells as above, the space field E is obtained by dividing a potential difference between two points in a space by a distance between the two points, i.e., by the following expression:

$$E=\{\phi(r+\Delta r-\phi(r)\}/\Delta r$$

where $\phi(r)$ is potential at a coordinate r and $\Delta r$ is the distance between the two points. To improve the calculation accuracy, the distance $\Delta r$ needs to be set to a small value, however, the smaller the distance, the smaller the denominator, which brings divergence. Because of this, the space field obtained from the potential difference results in containing a cancellation error as considered the most troublesome error in the numeric calculation, which greatly lowers the calculation accuracy of the space field. Accordingly, the space field obtained in this manner cannot be free from the cancellation error.

In view of solving the above problem to increase the calculation accuracy, the cell size or mesh size has to be decreased, increasing the number of calculation steps and causing a different problem in enormously increasing the amount of calculation time, for example, several days taken for one calculation.

SUMMARY OF THE INVENTION

The present invention aims to provide a method and a device which can measure the surface charge distribution of a sample such as a photoreceptor in a short period of time with high resolution in the order of micron on the basis of a potential at potential saddle point above the sample and an accelerated voltage of an incident charged particle.

According to one aspect of the present invention, a method for measuring the surface charge distribution of a sample, comprises a charging step of irradiating the sample with a charged particle beam and charging a surface of the sample in a spot-like manner; a first measuring step of irradiating the charged sample with the charged particle beam to measure a value of a potential at a potential saddle point formed above the sample; a selecting step of selecting one structure model from preset multiple structure models and selecting a tentative space charge distribution associated with the one structure model; a first calculating step of calculating a space potential at the potential saddle point by electromagnetic field analysis using the selected structure model and tentative space charge distribution; a determining step of comparing the calculated space potential and the measured value to determine the tentative space charge distribution as a space charge distribution of the sample when an error between the space potential and the measured value is within a predetermined range; and a second calculating step of calculating a surface charge distribution of the sample by electromagnetic field analysis based on the determined space charge distribution of the sample

BRIEF DESCRIPTION OF THE DRAWINGS

Features, embodiments, and advantages of the present invention will become apparent from the following detailed description with reference to the accompanying drawings.

DETAILED DESCRIPTION OF THE PREFERRED EMBODIMENT

Hereinafter, embodiments of the surface charge distribution measuring device and method according to the present invention will be described in detail with reference to the accompanying drawings. Wherever possible, the same reference numbers will be used throughout the drawings to refer to the same or like parts.

First Embodiment

Figure 1:
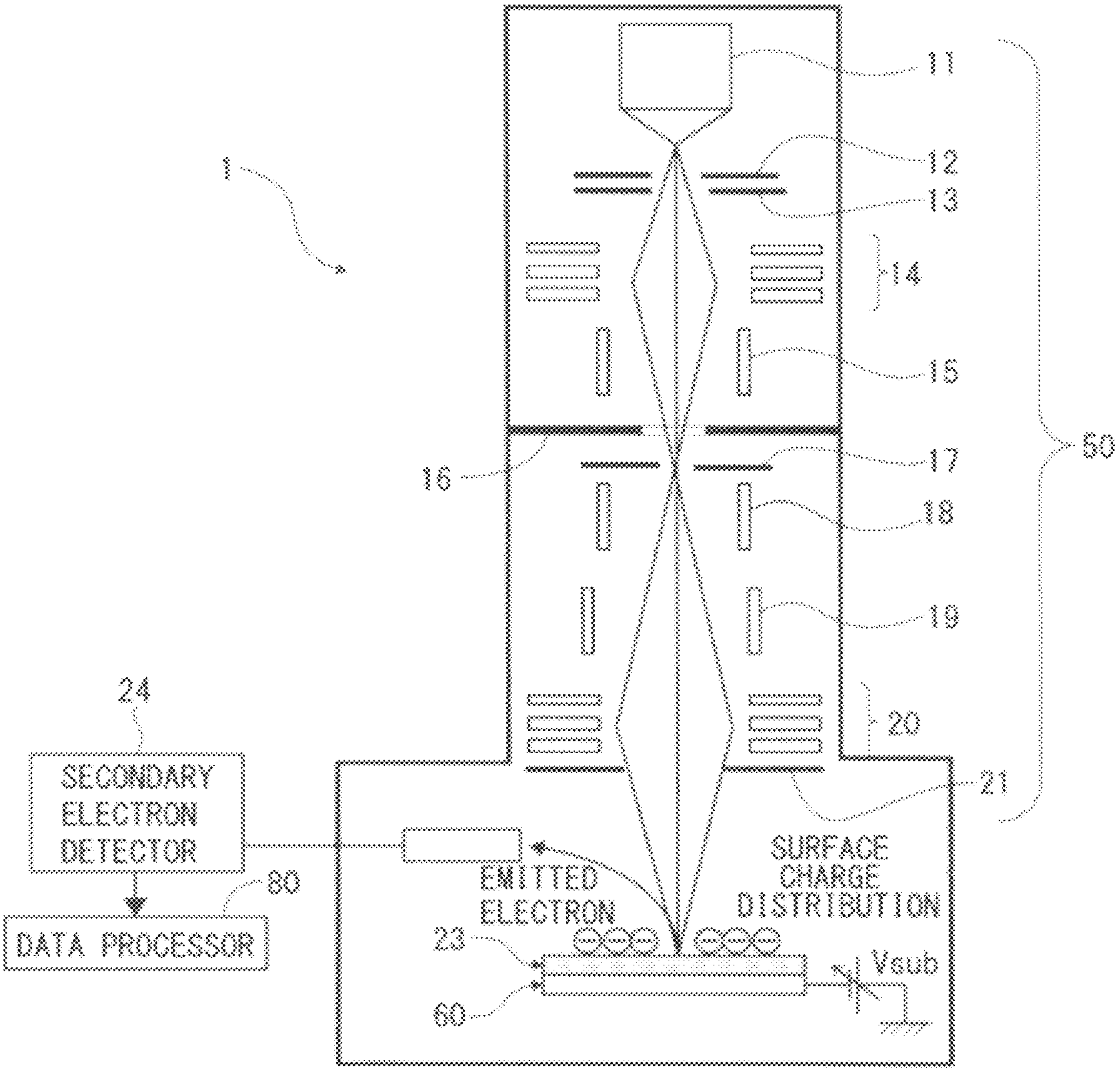
FIG. 1 shows an example of a surface charge distribution measuring device according to one embodiment of the present invention.
Figure 2:
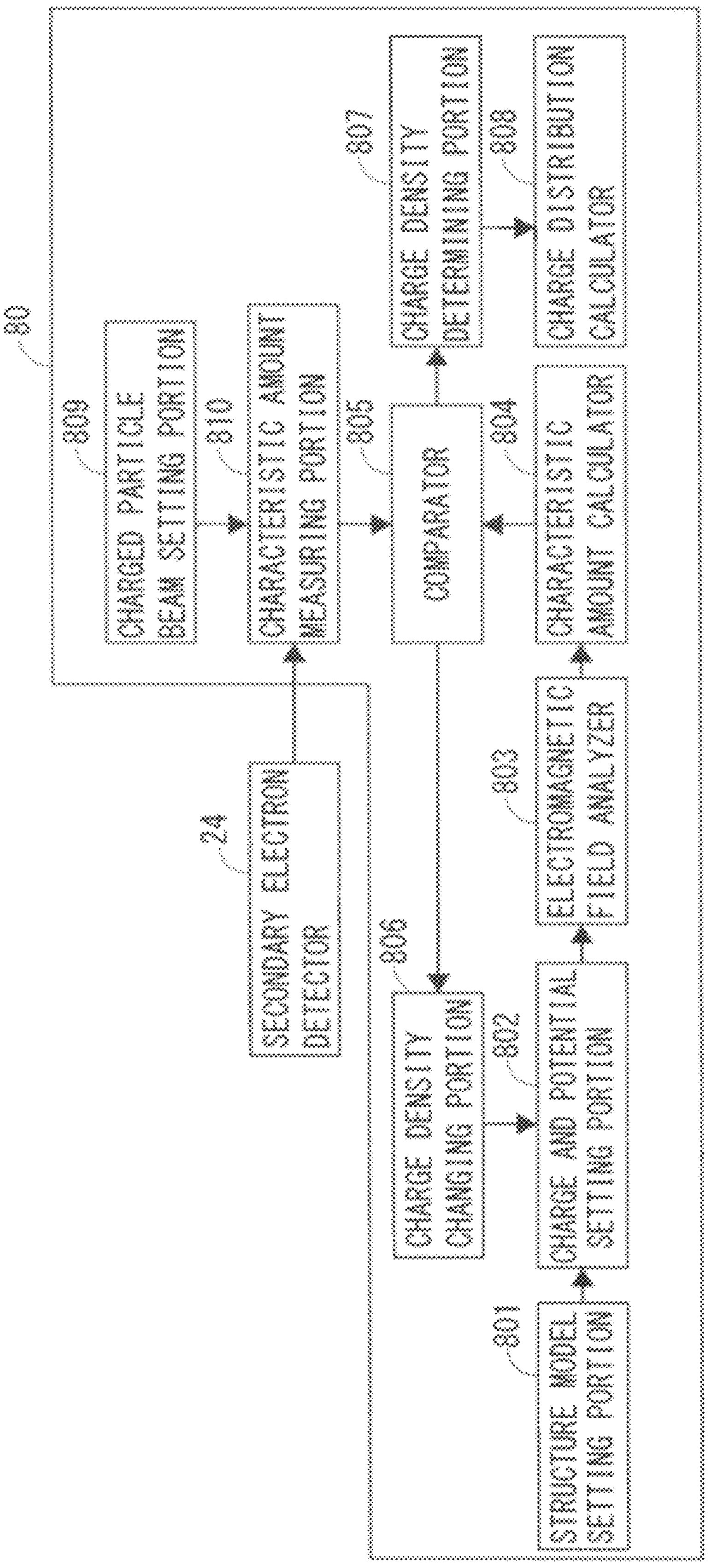
FIG. 2 is a block diagram showing a data processor of the measuring device in FIG. 1 in detail.

First, a device for measuring the surface charge distribution of a sample by scanning the sample with a charged particle beam and detecting primary inversion electrons and secondary electrons is described. FIG. 1 shows the structure of the device and FIG. 2 shows a secondary electron detector thereof in detail.

A surface charge distribution measuring device 1 comprises an optical system 50, a conductor 60 as a mount for a sample, a secondary electron detector 24, and a data processor 80. These elements are connected to a not-shown power supply source and controlled by a controller of a host computer.

The optical system 50 comprises an electron gun 11 for generating an electron beam as a charged particle beam, an extractor electrode 12 for controlling the electron beam, an acceleration electrode 13 for controlling the energy of the electron beam, an electrostatic condenser lens 14 to focus the electron beam generated from the electron gun, a beam blanking electrode 15 to control turning-on and -off of the electron beam, a partition 16, a movable diaphragm 17 to control the irradiation density of the electron beam, a stigmator 18 to correct the astigmatism of the electron beam having passed through the beam blanking electrode 15, a scan lens 19 as a deflection coil to scan with the electron beam having passed through the stigmator 18, an electrostatic objective lens 20 to focus the electron beam having passed through the scan lens 10 again, and an opening for beam exit 21. The respective lenses are connected to a not-shown drive power supply source. Note that herein, the charged particle refers to an electron beam or an ion beam which is affected by electric or magnetic field. With use of the ion beam, a liquid metal ion gun or the like is used instead of the electron gun 11.

The electron gun 11 includes a tungsten filament or LaB6 cathode so as to charge a sample 23 as a photoreceptor to be measured.

The conductor 60 is a mount on which the sample 23 as a photoreceptor is placed. After the sample is placed on the conductor 60, the inside of the housing of the surface charge distribution measuring device 1 becomes vacuumized by a not-shown vacuum pump to evaluate the surface charge distribution. The conductor 60 is connected with an external power supply source and applied with a voltage which is changeable.

The secondary electron detector 24 is a scintillator detector or a photoelectric multiplier detector, for example.

The data processor 80 in FIG. 2 comprises a structure model setting portion 801, a charge and potential setting portion 802, an electromagnetic field analyzer 803, a characteristic amount calculator 804, a comparator 805, a charge density changing portion 806, a charge density determining portion 807, a charge distribution calculator 808, a charged particle beam setting portion 809, and a characteristic amount measuring portion 810. The functions of these elements will be described later with reference to a flowchart in FIG. 7.

In the data processor 80 a program for measuring the surface charge distribution is operated to control the respective elements and realize a later-described surface charge distribution measuring method.

Next, a surface charge distribution measuring method using the above surface charge distribution measuring device 1 is described.

Figure 3A:
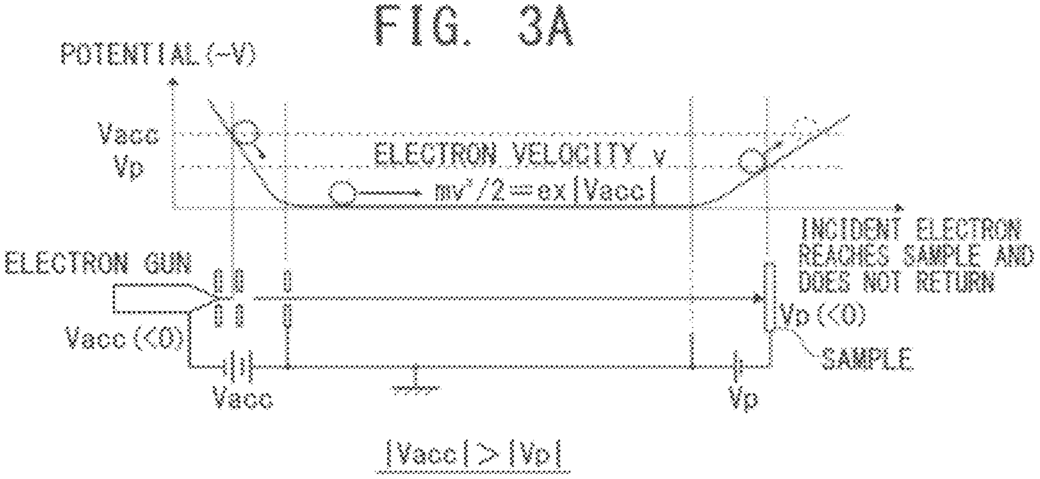
FIGS. 3A, 3B show a relation between an incident electron and a sample used in the measuring device.
Figure 3B:
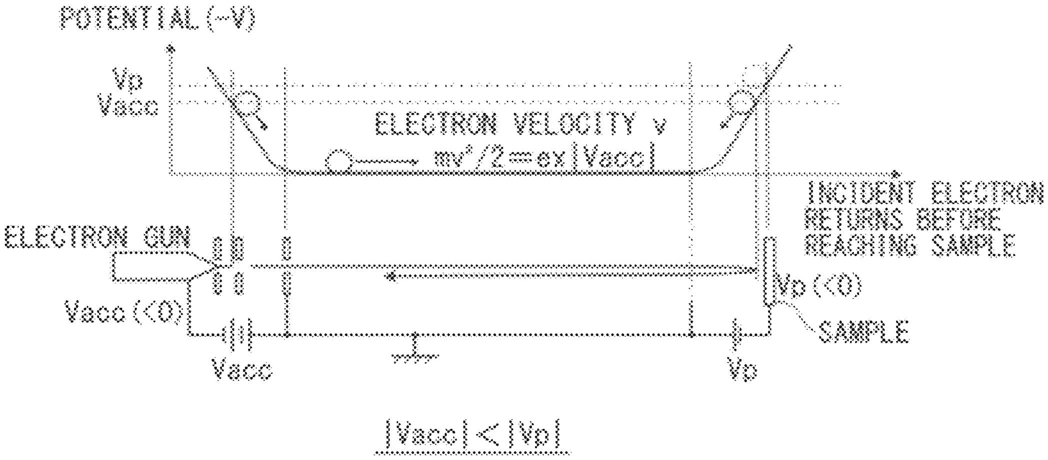

FIGS. 3A, 3B show a relation between the accelerated voltage Vacc of the electron beam and the potential Vp on the sample surface when the sample is evenly charged. Depending on a magnitude relation of the accelerated voltage Vacc and the potential Vp, an incident electron reaches the sample and does not return or it is inverted by the sample to return. Thus, there is a region in which the vertical velocity vector of an incident charged particle relative to the sample is inverted before reaching the sample, and a primary incident charged particle is detected in the region. Generally, the accelerated voltage is represented by a positive value, however, the accelerated voltage Vacc is of a negative value and for the sake of simple explanation, the accelerated voltage is set to be negative ($Vacc<0$) so is the potential Vp of the sample ($Vp<0$) herein.

Potential is an electric positional energy of a unit charge. An incident electron moves at a velocity corresponding to the accelerated voltage Vacc at the potential being 0(V). The closer to the sample surface the incident electron is, the higher the potential thereof is so that the velocity of the incident electron changes, affected by Coulomb repulsion of charges of the sample. This generally causes the following phenomenon.

At $|Vacc|>|Vp|$, the velocity of the electron is decreased but it reaches the sample as shown in FIG. 3A.

At $|Vacc|<|Vp|$, the velocity of the incident electron is gradually decreased, affected by the potential of the sample, and becomes zero before it reaches the sample. The incident electron travels reversely as shown in FIG. 3B.

In a vacuum state without air resistance, the conservation law of energy almost completely comes into effect. Therefore, the surface potential of the sample as a photoreceptor can be measured by measuring the energy on the sample surface when the energy of the incident electron is changed, that is, the landing energy becomes almost zero. Herein, a primary inversion charged particle is referred to as a primary inversion electron. The primary and secondary inversion charged particles are distinguishable by a boundary of brightness contrast since the amounts thereof reaching the detector are largely different.

A scanning electron microscope may include a reflection electron detector. A reflection electron generally refers to an electron reflected or scattered by the back face of the sample due to the interaction with the substances of the sample and flown out of the sample surface. The energy of the reflection electron is equal to that of the incident electron. The intensity of the reflection electron increases as the atomic number of the sample increases. Meanwhile, the primary inversion electron is inverted by the potential distribution on the sample surface before reaching the sample surface. It is completely different from the phenomenon used for the reflection electron detector of a scanning electron microscope.

Thus, the sample surface is scanned with the electron while the accelerated voltage Vacc or electrode potential on the back face of the sample is changed and the incident electron is detected by the detector, making it possible to measure the surface potential Vp of the sample.

At the potential Vp of the sample being positive ($Vp>0$), positive ions or protons such as gallium can be incident as charged particles.

As described above, when evenly charged, the sample is scanned with the charged particles so that the following relation of the accelerated voltage Vacc and the potential distribution Vp(x) of the sample is satisfied.

$$\mathrm{Min}\,|Vp| \leq |Vacc| \leq \mathrm{Max}\,|Vp|$$

Thereby, the region in which the vertical velocity vector of the incident charged particle relative to the sample is inverted is created. Data on the surface charge distribution of the sample can be obtained by detecting the primary inversion charged particle.

Figure 4:
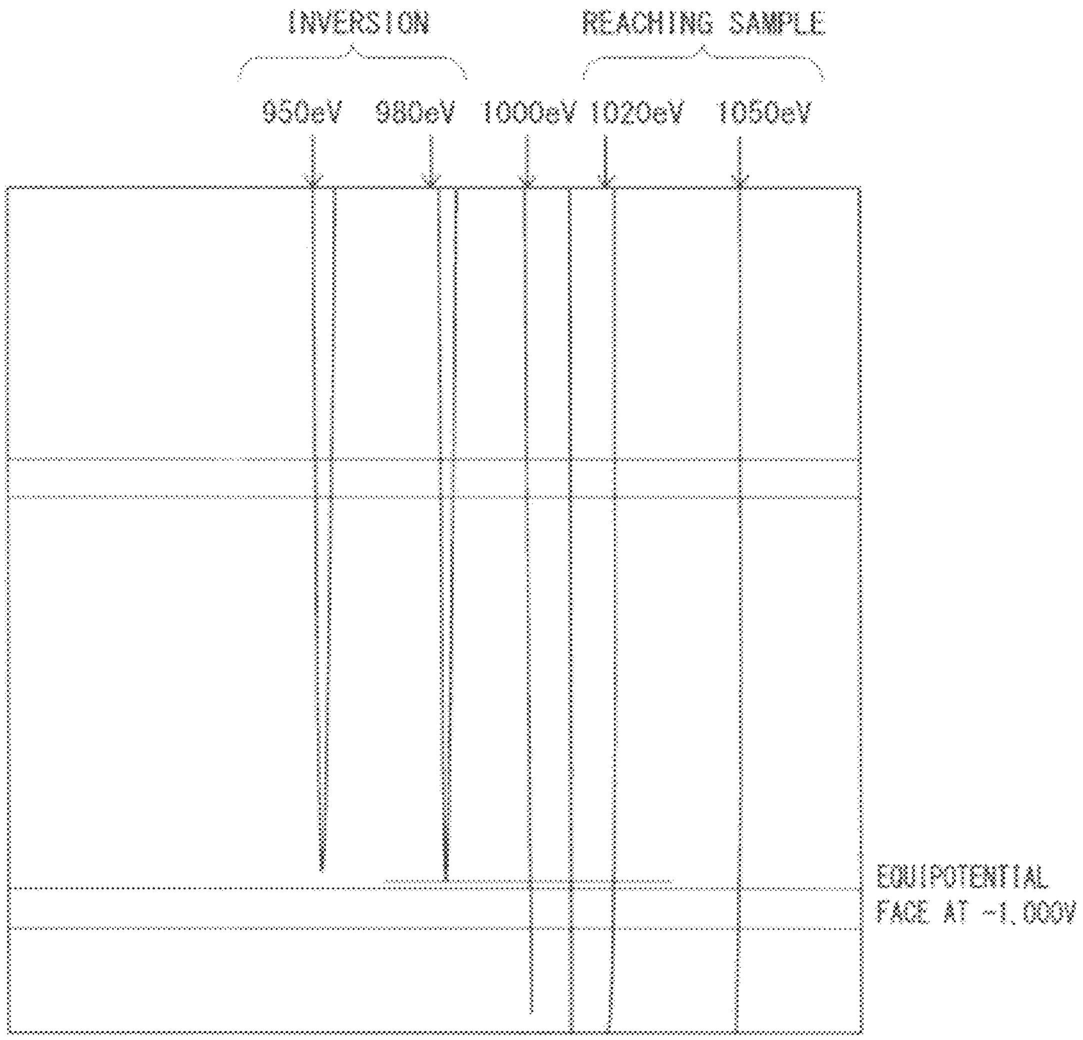
FIG. 4 shows the orbit of an incident electron.

FIG. 4 shows the orbit of the incident electron when the sample surface is evenly charged at potential of −1,000V. It is seen from the drawing that at the potential being 1,000 eV or more, the incident electron reaches the sample while at the potential being less than 1,000 eV, the incident electron is inverted before reaching the sample. At the potential being 1,000 eV, the energy of the incident electron becomes zero on the sample surface.

Thus, it is able to measure the surface charge of the sample which is evenly charged or has a potential distribution with a small difference of several ten voltages or less by changing the accelerated voltage so that the velocity of the electron beam reaching the sample surface becomes zero.

Meanwhile, with regard to the sample charged in a spot-like manner, data on the surface charge distribution is obtained differently from that of the evenly charged sample.

A potential saddle point is formed above the sample charged in a spot-like manner. The potential saddle point is an extreme value of a saddle shaped space potential distribution occurring from the charge distribution of the sample.

Figure 5A:
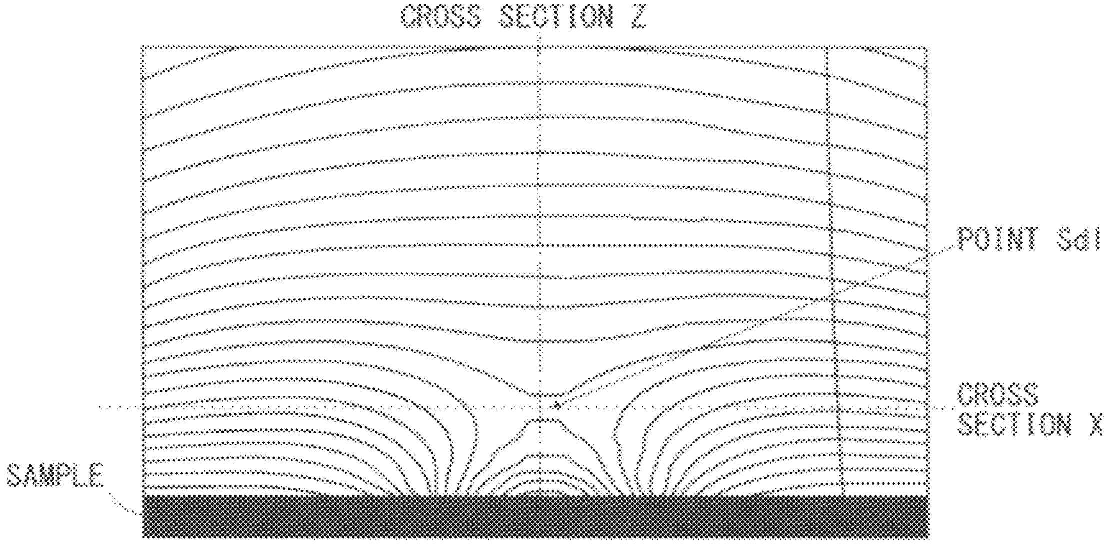
FIGS. 5A to 5D are graphs showing a contour line of a space potential when a potential saddle point is formed, a surface potential distribution, and a space potential distribution.
Figure 5B:
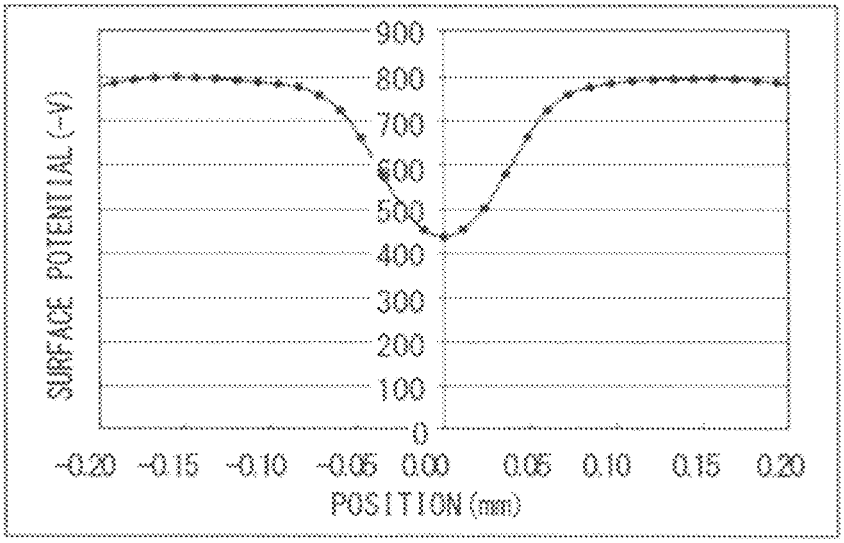
Figure 5C:
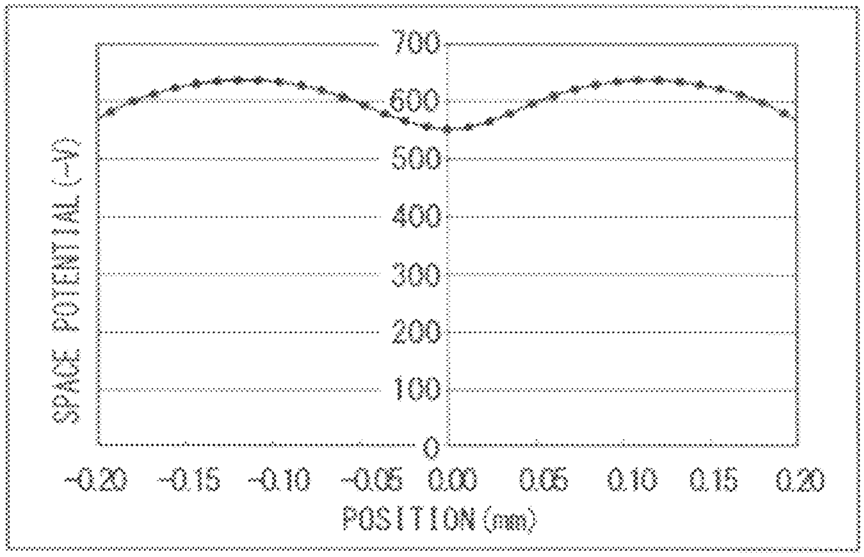
Figure 5D:
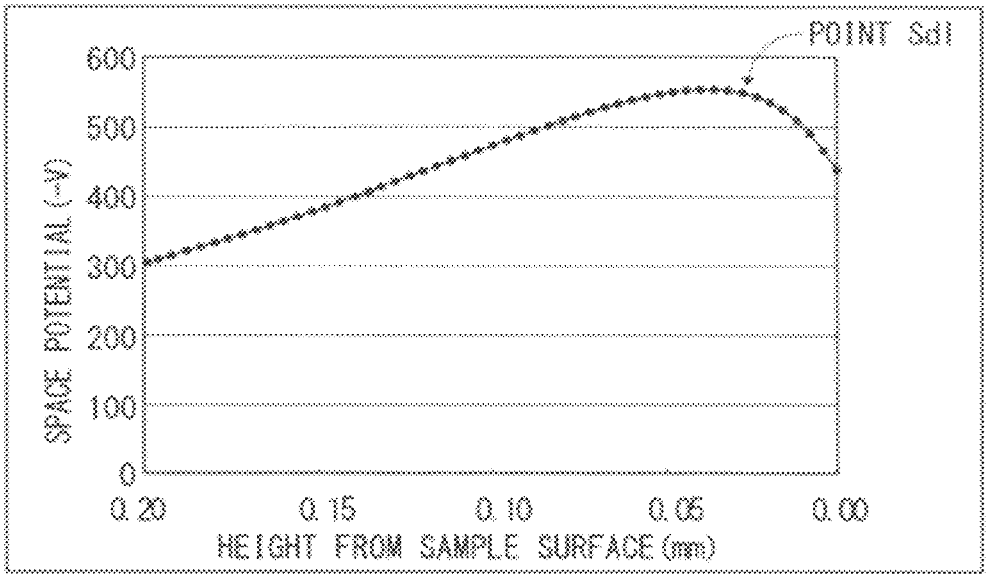

FIG. 5B shows the surface potential of the sample in a horizontal direction in FIG. 4A. When the sample shows a potential distribution in such a shape as in FIG. 5B, the space potential above the sample is formed as shown in FIG. 5A. The space potential distribution of the sample in the horizontal direction (along the cross section X) takes the minimal value at a point Sd1 as shown in FIG. 5C. The space potential distribution thereof in the vertical direction (along the cross section Z) takes a maximal value at the point Sd1. The point Sd1 is defined as the potential saddle point.

With presence of the potential saddle point, the velocity of the incident electron reaching the sample surface cannot become zero even with a change in the accelerated voltage of the electron beam irradiating the sample. Especially, at the potential distribution being several ten voltages or more, it is not able to measure the potential because of the potential saddle point by simply determining whether or not the incident charged particle has reached the sample.

In view of this, the surface charge distribution measuring method according to one embodiment of the present invention calculates an estimated surface potential of the sample by charging the sample in a spot-like manner, generating the potential saddle point, and comparing the measured value of the potential at the potential saddle point and the value of the potential at the potential saddle point calculated from a structure model. In the following the estimation of the surface charge distribution according to one embodiment of the present invention will be described in detail.

Figure 6:
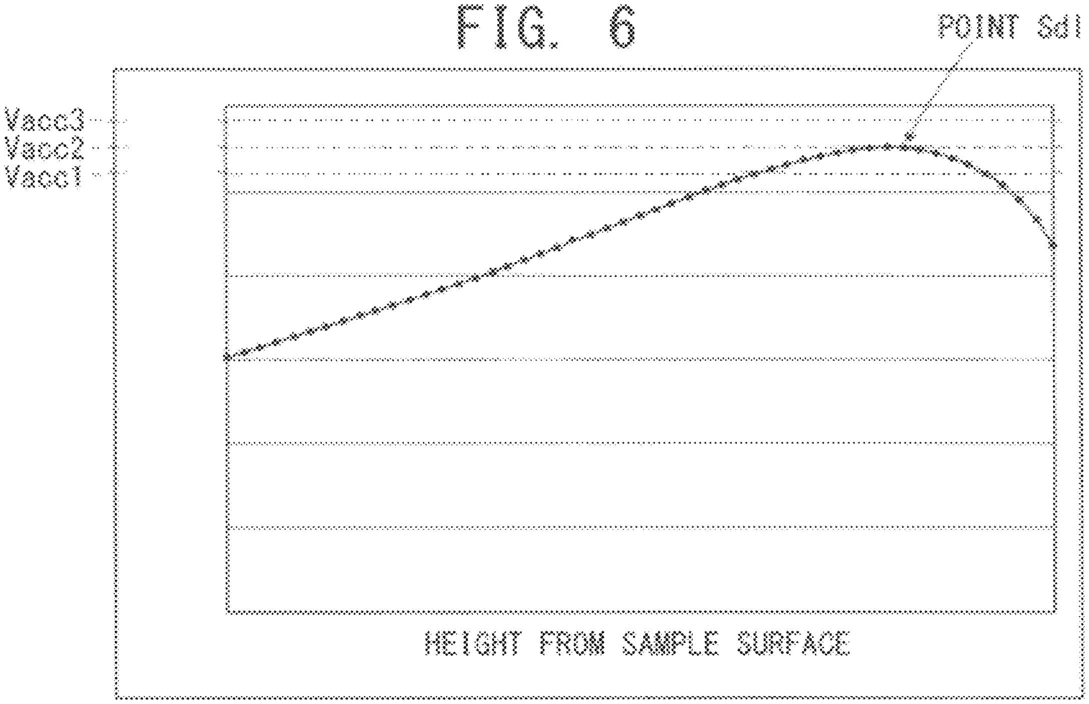
FIG. 6 is a graph showing a relation between the potential saddle point and accelerated voltage.

First, the potential of the sample at the potential saddle point is measured. FIG. 6 shows a relation between the potential saddle point and the accelerated voltage. Under a condition that |Vacc1|<|Vsd1| where Vsd1 is the potential at the potential saddle point, the accelerated voltage is too low for the incident charged particle to exceed the potential saddle point and the incident charged particle is inverted and reaches the detector.

Under a condition that |Vacc3|>|Vsd1|, the accelerated voltage is high enough for the incident charged particle to exceed the potential saddle point so that it reaches the sample, and a secondary electron is generated. However, the energy of the secondary electron is too low to escape from the potential saddle point. As a result, the secondary electron cannot reach the detector.

A condition that |Vacc2|=|Vsd1| is a branching point at which the detection signal reach or does not reach the sample.

Accordingly, the potential Vsd1 at the potential saddle point can be measured by deciding the accelerated voltage Vacc2 as a branching point for reaching or not reaching the sample, while the accelerated voltage Vacc is changed from Vacc1 to Vacc3.

Next, electromagnetic field analysis is conducted using a structure model pre-set and stored and a tentative charge distribution Q(x, y) to calculate the space potential Vsd1_*s* at the potential saddle point. The electromagnetic field analysis is to analyze the interaction of a subject and electric and magnetic fields based on Maxwell's equations using the structure model of the conductor 60 and the sample 23 as a dielectric.

First Embodiment

Figure 7:
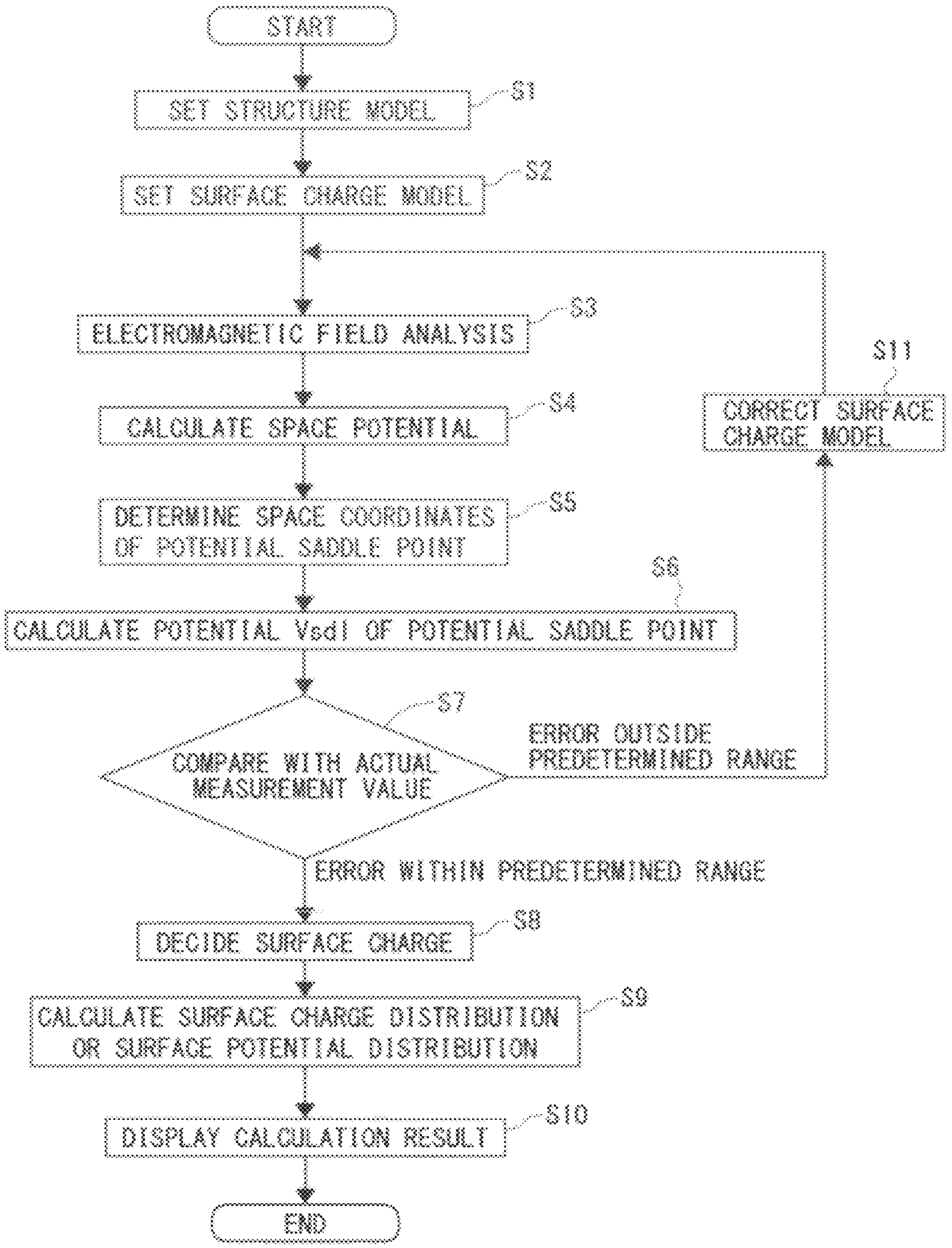
FIG. 7 is a flowchart for measuring the surface charge distribution according to one embodiment of the present invention.

FIG. 2 shows the structure of the data processor 80 of the surface charge distribution measuring device 1 according to a first embodiment and FIG. 7 is a flowchart for calculating the surface charge using the structure model. With reference to the drawings, the surface charge distribution method using the device 1 is described.

In step S1, the structure model setting portion 801 selects a structure model with the same or similar structure as that of the sample from multiple structure models stored in a not-shown memory unit of the surface charge distribution measuring device 1 and set (sees FIG. 8-9) it to be used for the distribution measurement. The structure model setting portion 801 is operated automatically or manually by an operator.

In step S2 a surface charge model is set for the set structure model in step S1 by the charge and potential setting portion 802. Multiple surface charge models associated with the structure models are also stored in the above memory unit, and one model is selected as a tentative surface charge model. The charge and potential setting portion 802 is also operated automatically or manually by an operator.

In step S3 the electromagnetic field analysis is conducted using the selected structure model and tentative surface charge model by the electromagnetic field analysis portion 803.

In step S4 the space potential formed over the sample 23 is calculated by the electromagnetic field analysis portion 803.

In step S5 a space coordinate of the potential saddle point of the sample is specified based on the calculated space potential in step S4 by the electromagnetic field analysis portion 803.

In step S6 the potential Vsd1_*s* at the potential saddle point is calculated by the characteristic amount calculator 804.

In step S7 the potential Vsd1 actually measured and the potential Vsd1_*s* calculated are compared by the comparator 805. When an error between the potentials Vsd1 and Vsd_s is within a predetermined range, a tentative charge distribution Q(x, y) is estimated to be the space charge distribution of the sample 23 by the charge density determining portion 807 in step S8. Then, the flow proceeds to step S9.

In step S9 the surface charge distribution Vs (x, y) of the sample 23 is calculated based on the estimated space charge distribution Q(x, y) by the charge distribution calculator 808. In step S10 a result of the calculation is displayed on a not-shown display or else of the surface charge distribution measuring device. The flow is completed.

Meanwhile, when the error is beyond the predetermined range in step S7, the tentative charge distribution Q(x, y) is corrected in step S11 by invoking another charge distribution pre-stored in the memory unit. After the correction, the flow returns to step S3.

The surface charge distribution measuring method and device according to the first embodiment can measure the surface charge distribution of the sample with high resolution in the order of micron. Further, it is able to greatly reduce the number of times at which charges and potentials of the sample are measured to only the number of times needed for finding the potential saddle point as well as to greatly reduce the required amount of calculation for the electromagnetic field analysis by calculating the surface charge distribution using the pre-set structure model. Thus, it is able to find the surface charge distribution of the sample in a short period of time.

Second Embodiment

Surface charge distribution measuring method and device according to a second embodiment additionally include a series of steps or elements to correct the charge distribution based on a plurality of measured values other than the potential at the potential saddle point. Thereby, it is able to more accurately find the surface charge distribution.

Specifically, the calculated surface charge distribution of the sample is evaluated using an evaluation function expressed by parameters indicating different shapes of the charge density distribution and corrected to one with an optimal value and a shape by comparing the result of the evaluation and the measured value.

The charge density distribution can be represented by the following expression (1):

$$Q(x, y) = Q_{max} - QD \times \exp\left\{-\left(\frac{x^2}{\sigma_x^2} + \frac{y^2}{\sigma_y^2}\right)^{\alpha}\right\}$$

where charge dispersion is σx, σy, the depth of charge is QD, periphery charge is Qmax, α is a coefficient for representing the shape of surface charge distribution. At α=1, the function is a Gaussian function and the closer to infinity α is, the closer to a rectangular function the function is.

The function for representing the surface charge distribution is not limited to the above function.

Figure 10:
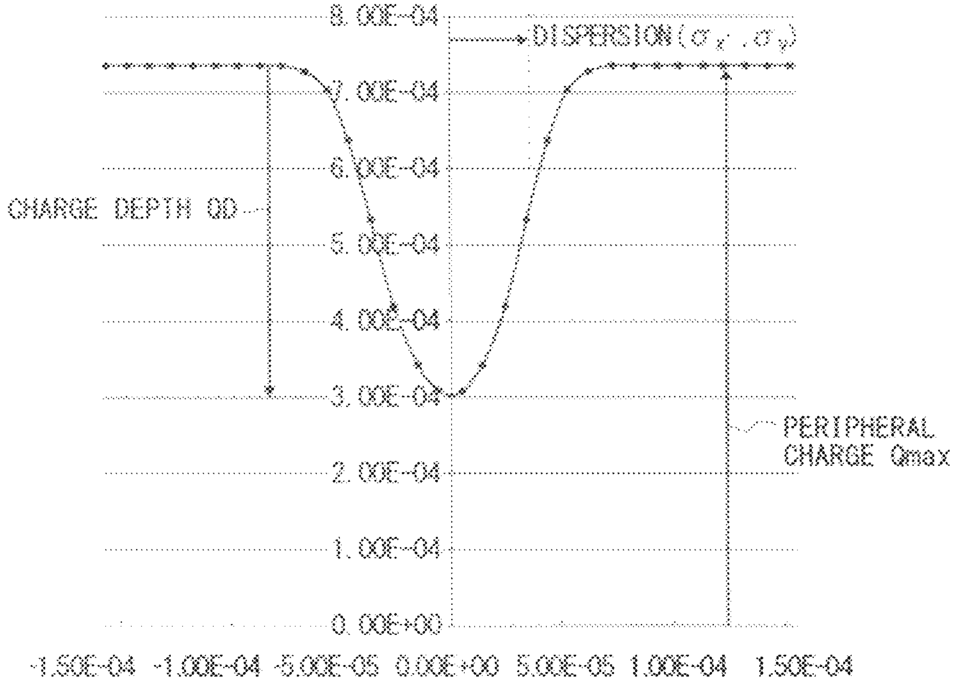
FIG. 10 is a graph showing the surface charge distribution of a sample.

FIG. 10 shows an example of the charge density distribution model of a dielectric surface by the above function when Qmax=$7.355\times10^{-4}$ (C/m$^2$), QD=$3.0\times10^{-4}$ (C/m$^2$), σx=$4.0\times10^{-5}$ (m), σy=$5.66\times10^{-5}$ (m), and α=1.4. Thus, mathematizing the surface charge distribution of the sample makes it possible to set an evaluation function such that an error between the measured and calculated surface charge distributions becomes minimal, and makes it easier to search for the condition that the error becomes minimal.

The evaluation function δeval which is the surface charge distribution mathematized by the parameters is set on the basis of the above function representing the charge distribution of the sample. To evaluate the calculated surface charge distribution, the evaluation function δ is to extract a characteristic amount as a proper evaluation item from a plurality of physical quantities obtained by the electromagnetic analysis, find a difference between the characteristic amount and a measured characteristic amount and multiple the difference by weight to find the sum of squares. By a convergence test, the evaluation function can be set to be a minimal or allowable value to determine parameters for the surface charge distribution.

The evaluation function δeval can be represented by the following expression (2):

$$\delta_{eval} = \sum_{k=1}^{n} \omega_k^2 \times SM_k^2$$

where SMk is a characteristic amount of S-type characteristics as an evaluation criterion based on the measured or calculated value of a predetermined characteristic amount.

To compare the measured and calculated characteristic amounts, the evaluation function can be represented by the following expression (3):

$$\delta_{eval} = \sum_{k=1}^{n} \omega_k^2 \times (S_k - M_k)^2$$

where Sk is a calculated characteristic amount, Mk is a measured characteristic amount and ωk is weight.

Preferably, n is at least 2 or more. The characteristic amount used in the evaluation function can be charge potential corresponding to the peripheral charge Qmax, potential at the potential saddle point related to the depth of charge, diameter of a latent image related to the charge dispersion, or size of a latent image. However, it should not be limited to these.

Figure 13:
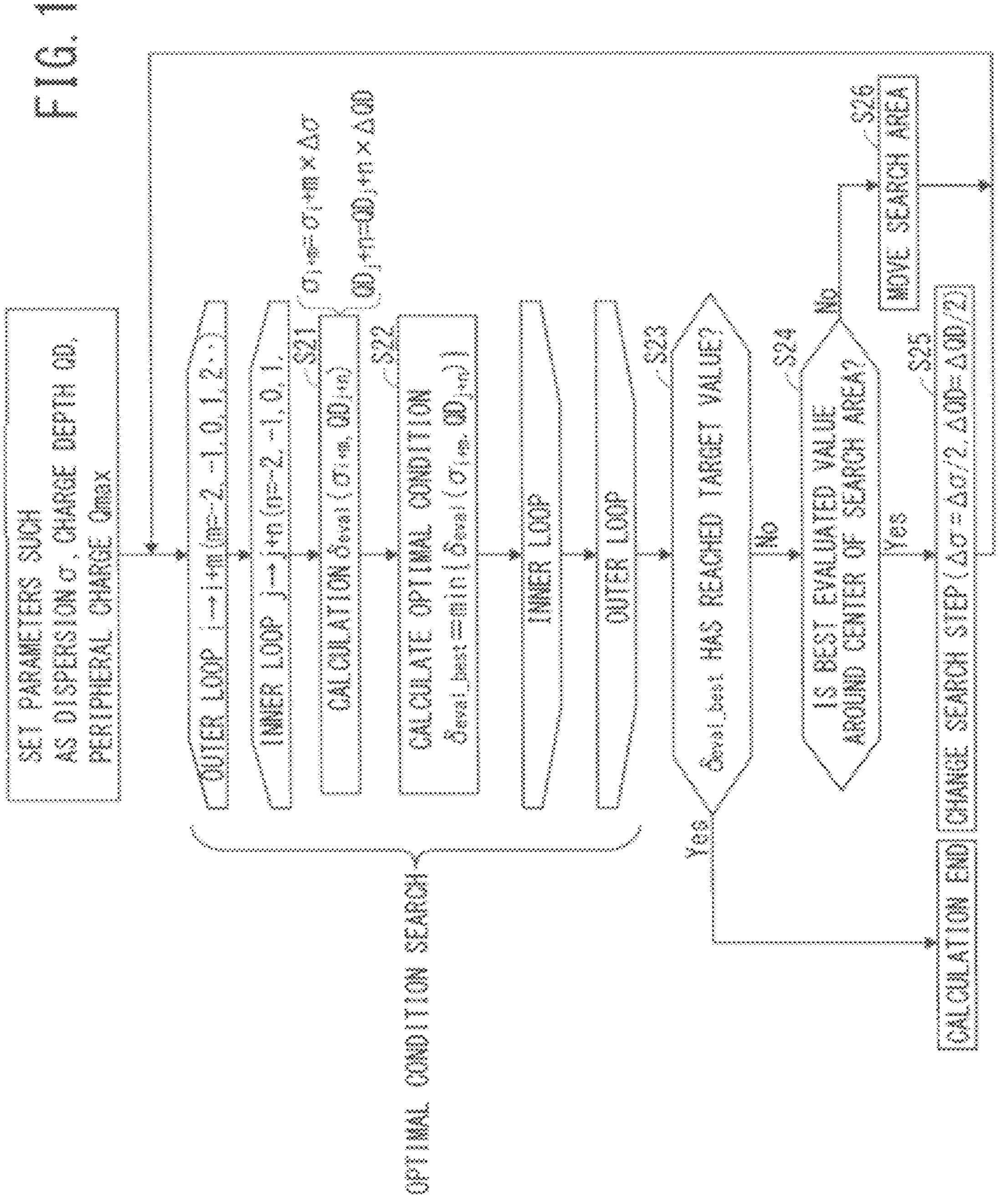
FIG. 13 is a flowchart for searching an optimal condition to set an optimal characteristic amount used for correcting a calculated surface charge distribution of the sample, by way of example.

Now, correcting an estimated surface charge distribution by calculation with the evaluation function is described with reference to a flowchart in FIG. 13. This evaluation function uses two characteristic amounts, the charge depth QD and charge dispersion σ, by way of example. In FIG. 13 the outer loop and inner loop indicate that charges at the total 25 (5×5) points are calculated and evaluated while values of i and j when σ=σi and QD=QDj are changed to −2, −1, 1, and 2.

In step S21 the charge depth QD and charge dispersion a as characteristic amounts are arranged at two orthogonal axes as shown in FIG. 11 and 5 points (5×5 in the drawing) around the initial values of the two characteristic amounts are selected to find the evaluation function δeval for the selected combinations.

In step S22 the best evaluated point δeval_best (with best or lowest value δeval) is found from the calculated 25 points (5×5).

In step S23 a determination is made on whether or not the value at δeval_best reaches a predetermined target value. The flow proceeds to step S24 when the value has not reached the target value. The calculation is completed when the value has reached the target value.

Figure 11A:
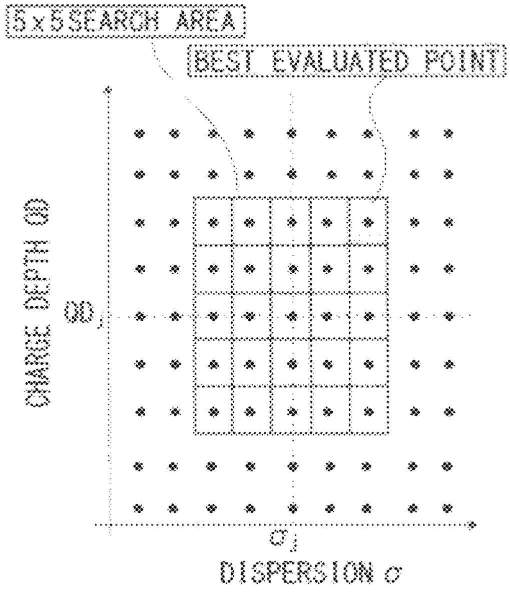
FIGS. 11A, 11B show an example of how to search an optimal condition to set an optimal characteristic amount used for correcting a calculated surface charge distribution of the sample.

In step S24 a determination is made on whether or not the point δeval_best is included in about the center, that is, the center 3×3 area of the search area as shown in FIG. 11A. The flow proceeds to step S26 when the value is not included in the center area.

Figure 11B:
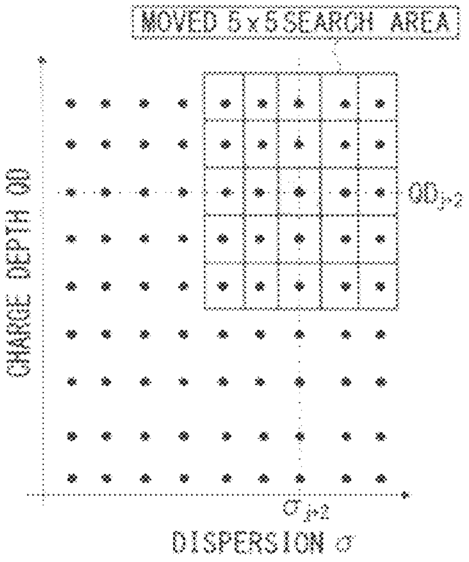

In step S26 with the values of ΔQD and Δσ fixed, the 5×5 search area is moved so that the best evaluated point comes at the center of the search area as shown in FIG. 11B. Then, returning to step S21, the δeval is calculated and evaluated for the new 5×5 search area. These steps are repeated to roughly specify the search area.

An example of the step S26 is shown in FIGS. 11A, 11B. In this example at σ=σi and QD=QDj, neighborhood points when a step width is moved by the integral multiple of ΔQD and Δσ (m, n=−2, −1, 01) are subjected to the electromagnetic field analysis to calculate by the evaluation function. The δeval is calculated again in an area around the best evaluated point. The parameters are changed to m=2, n=2, $\sigma_{i+2}=\sigma_i+2\times\Delta\sigma$, and $QD_{i+2}=QD_i+2\times\Delta QD$ in this example.

Figure 12B:
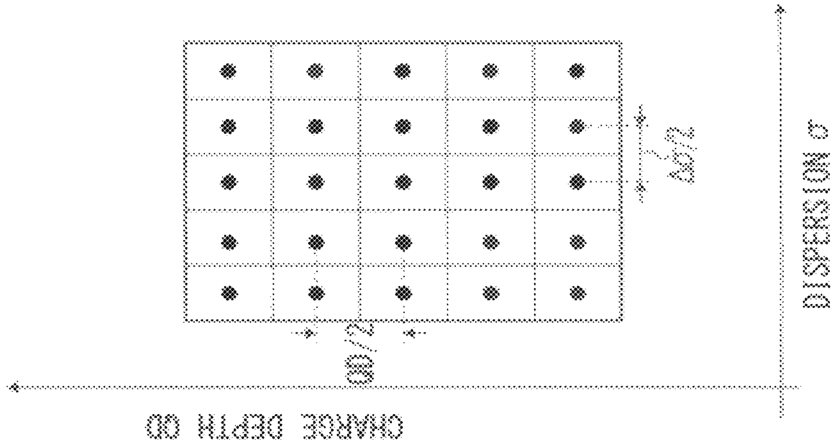
FIGS. 12A, 12B show another example of how to search an optimal condition to set an optimal characteristic amount used for correcting a calculated surface charge distribution of the sample.
Figure 12A:
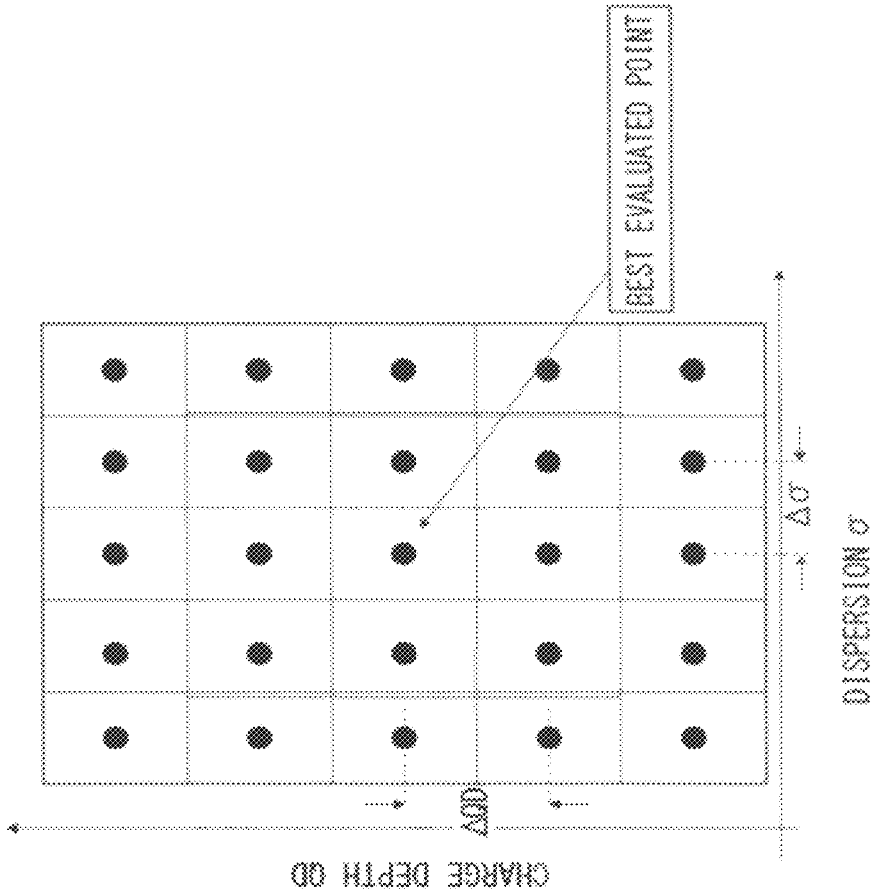

Meanwhile, in step S24 when the point δeval_best is around the center of the evaluated 5×5 search area as shown in FIG. 12A, with the point as the center of the area, the values of ΔQD and Δσ are set to a half, that is, ΔQD→ΔQD/2, Δσ→Δσ/2, as shown in FIG. 12B.

Thus, the search area is narrowed from the one used for the first evaluation, and the flow returns to step S21 so that 5×5 area is searched again to find a point with a best evaluated value. This is repeated to make the charge depth QD and charge dispersion a closer to the optimal combination until the value at the point δeval_best reaches the target value in step S23. Thus, it is made possible to automatically search for the optimal parameters.

Δσ and ΔQD can be set to arbitrary values. It is preferable that the initial values are set to ones 8 to 32 times larger than the target values for the purpose of searching a broader area. With the final target value being 1 μm and potential being 2V, the proper value of Δσ is about 8 to 32 μm and that of ΔQD is about 16 to 64V. Further, the number of the parameters used for the evaluation function can be 3 or more.

When the calculated value at δeval-best reaches the target value, that is, differences in the measured values and calculated values of the two characteristic amounts, charge density QD and charge dispersion G are within a predetermined range, the calculated surface charge distribution of the sample is corrected by the electromagnetic field analysis based on the two characteristic amounts.

Thus, according to the surface charge distribution measuring method, it is able to more accurately obtain the surface charge distribution of the sample since the calculated surface charge distribution is corrected according to multiple measured values other than the potential at the potential saddle point.

Third Embodiment

The surface charge distribution measuring method can be configured that for measuring the potential saddle point, the applied voltage Vsub to the conductor 60 as a backside electrode can be changed while the accelerated voltage Vacc is fixed. In this manner the incident optical system can be fixed whereas the focal length or else of the incident optical system is changed by a change in the accelerated voltage.

Figure 14:
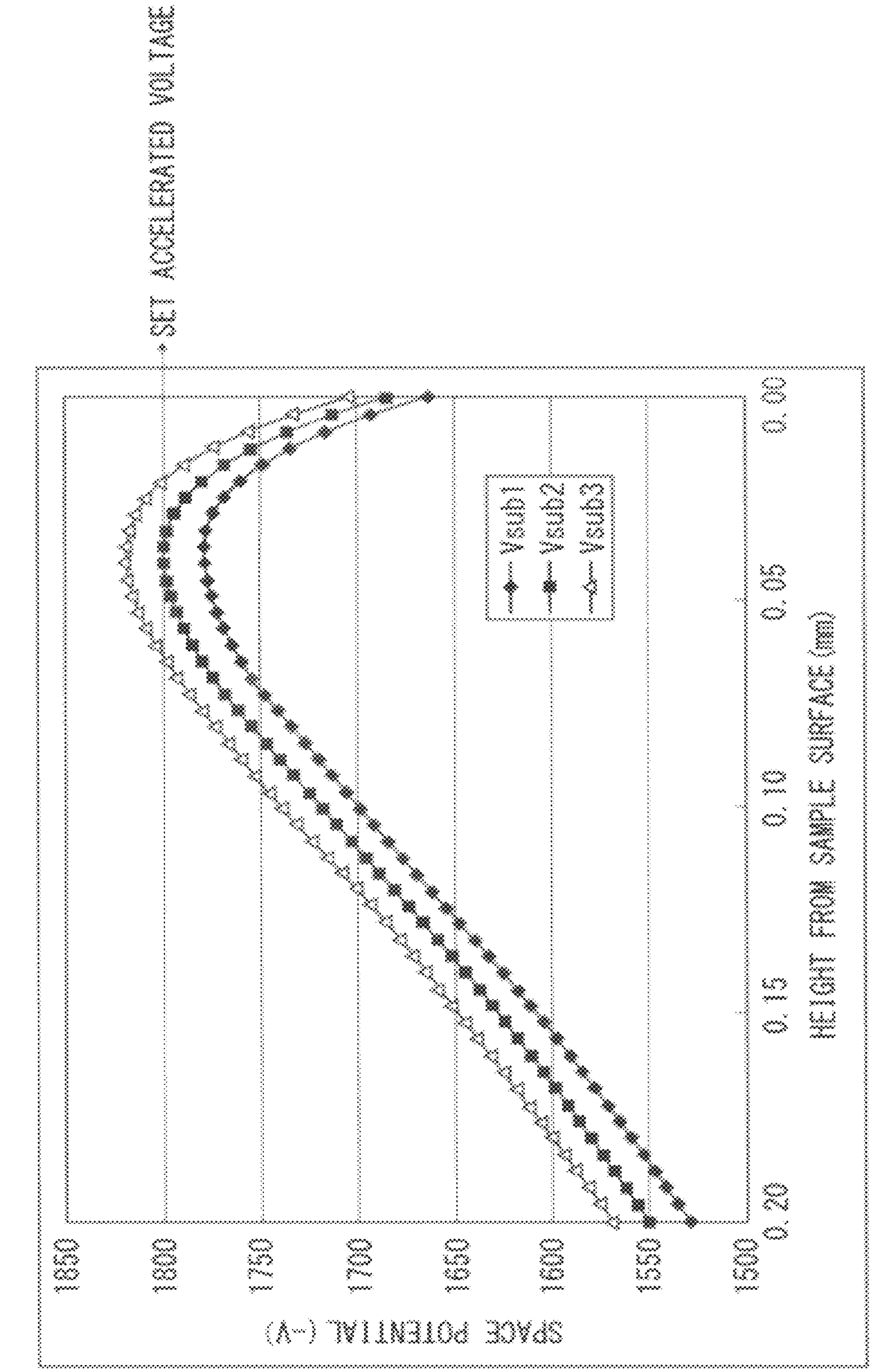
FIG. 14 is a graph showing a relation between the potential saddle point and the applied voltage to a conductor.

With the voltage Vsub applied to the conductor 60, the space potential is offset. FIG. 14 shows a relation between the potential saddle point and backside applied voltage, or a space potential distribution when Vsub1=−1,227V, Vsub2=−1,247V, Vsub3=−1,267V.

With the accelerated voltage Vacc fixed at −1,800V and the applied voltage being Vsub3, an incident charged particle cannot exceed the potential saddle point due to the low accelerated voltage so that it is inverted to reach the detector.

At the applied voltage being Vsub1, the accelerated voltage is higher than the potential saddle point so that an incident charged particle can exceed the potential saddle point and reaches the sample and causes a secondary electron. The energy of the secondary electron is, however, too small to escape from the potential saddle point. As a result, the secondary electron cannot reach the detector.

At the applied voltage being Vsub2, it becomes a branching point for detection or non-detection of a signal and the potential of potential saddle point and the accelerated voltage can be considered to match each other.

Accordingly, with the fixed accelerated voltage, by deciding the applied voltage Vsub2 as the branching point for the incident charged particle to reach or not reach the sample while the voltage is changed from Vsub1 to Vsub3, the potential Vsd1_*s* of the measured potential saddle point can be measured.

Figure 15:
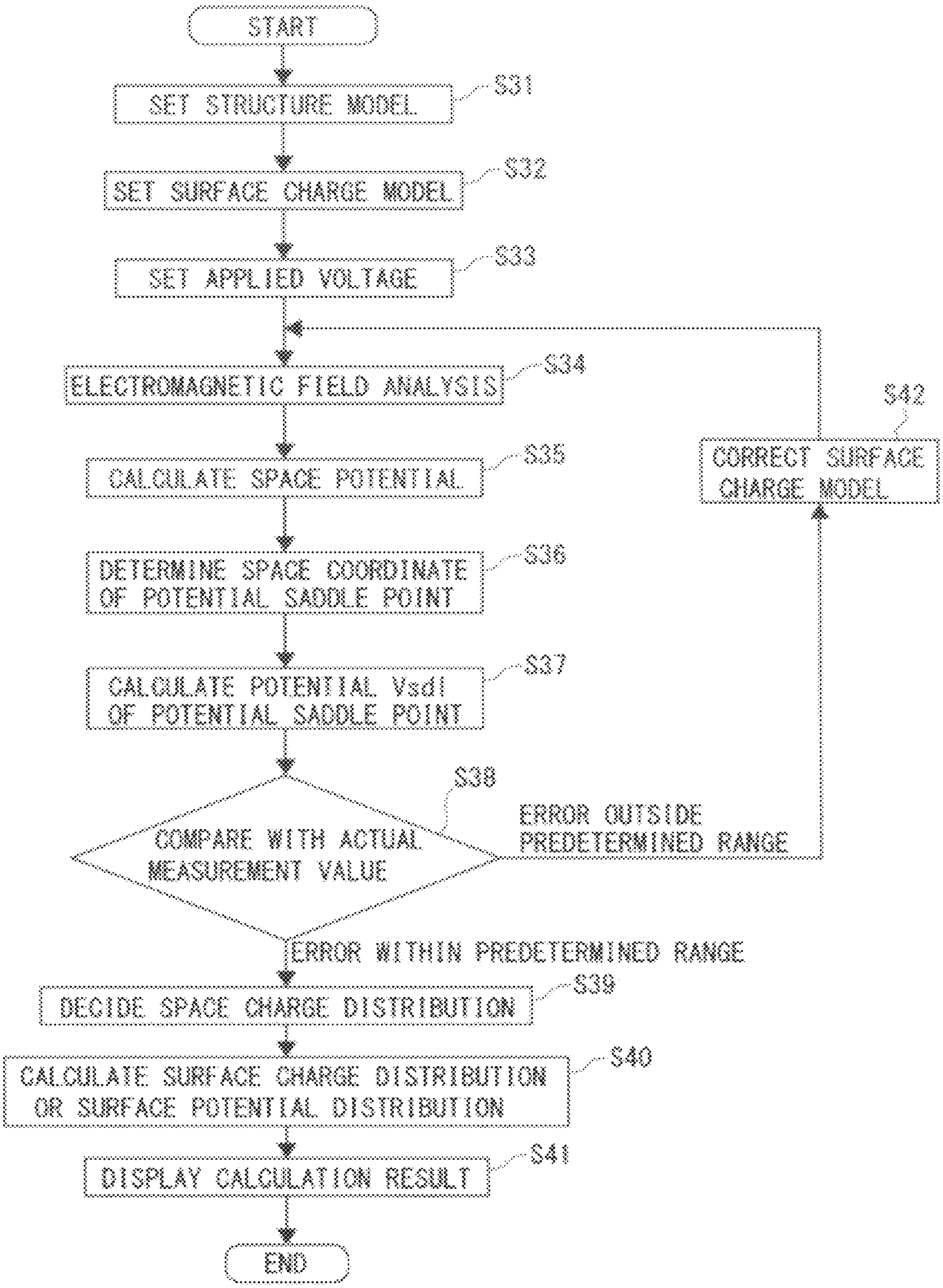
FIG. 15 is a flowchart for searching an optimal condition to set an optimal characteristic amount used for correcting a calculated surface charge distribution of the sample, by way of another example.

FIG. 15 is a flowchart for calculating the surface charge using the structure model. The surface charge distribution measuring method according to the present embodiment is described referring to the flowchart.

First, in step S31 the structure model setting portion 801 selects a structure model with the same or similar structure as that of the sample from multiple structure models stored in the not-shown memory unit of the surface charge distribution measuring device 1 and sets (sees FIG. 8-9) it to be used for the distribution measurement. The structure model setting portion 801 is operated automatically or manually by an operator.

In step S32 a surface charge model is set for the set structure model in step S31 by the charge and potential setting portion 802. Multiple surface charge models associated with the structure models are also stored in the above memory unit, and one model is selected as a tentative surface charge model. The charge and potential setting portion 802 is also operated automatically or manually by an operator.

In step S33 an applied voltage to the conductor 60 is set to the voltage Vsub2 which is decided to be the branching point for the incident charged particle to reach or not reach the sample while the applied voltage is changed from Vsub1 to Vsub3 as described above.

In step S34 the electromagnetic field analysis is conducted using the selected structure model and tentative surface charge by the electromagnetic field analysis portion 803.

In step S35 the space potential formed over the sample 23 is calculated as a part of the electromagnetic field analysis by the electromagnetic field analysis portion 803.

In step S36 the space coordinate of the potential saddle point of the sample is determined on the basis of the calculated space potential in step S35 by the electromagnetic field analysis portion 803.

In step S37 the potential Vsd1_*s* at the potential saddle point is calculated by the characteristic amount calculator 804.

In step S38 the potential Vsd1 measured and the potential Vsd1_*s* calculated are compared by the comparator 805. When an error between the potentials Vsd1 and Vsd_*s* is within a predetermined range, the tentative charge distribution model Q(x, y) is estimated to be the space charge distribution of the sample 23 by the charge density determining portion 807 in step S39. Then, the flow proceeds to step S40.

In step S40 the surface charge distribution Vs (x, y) of the sample 23 is calculated on the basis of the estimated space charge distribution by the charge distribution calculator 808. In step S41 a result of the calculation is displayed on a not-shown display or else of the surface charge distribution measuring device. The flow is completed.

Meanwhile, when the error is outside the predetermined range in step S38, the tentative charge distribution model Q(x, y) is corrected in step S42 by invoking another charge distribution pre-stored in the memory unit. After the correction, the flow returns to step S34.

The surface charge distribution measuring method and device according to the third embodiment can also measure the surface charge distribution of the sample with high resolution in the order of micron. Further, it is able to greatly reduce the number of times at which charges and potentials of the sample are measured to only the number of times needed for finding the potential saddle point as well as to greatly reduce the required amount of calculation for the electromagnetic field analysis by calculating the surface charge distribution using the pre-set structure model. Thus, it is able to find the surface charge distribution of the sample in a short period of time.

Fourth Embodiment

In the above embodiments the surface charge distribution is calculated using the charge dispersion as a characteristic amount other than the potential at the potential saddle point.

When the sample is a photoreceptor for example, the estimate or target value of the charge dispersion can be set in accordance with an electron beam size irradiated to the photoreceptor, exposure amount, or lighting time.

However, by use of a sample of which the charge dispersion cannot be directly measured easily, it is difficult to determine the estimate or target value of the charge dispersion in the above manner. In such a case it is effective to find the charge dispersion by calculating an electric field vector on the sample surface to derive a coordinate (hereinafter, Ez=0 threshold) at which the vertical electric field intensity relative to the sample becomes zero. In the present embodiment the surface charge distribution is calculated by finding the diameter of a latent image associated with the charge dispersion on the basis of the Ez=0 threshold to find the charge dispersion from the latent image diameter for calculating the surface charge distribution.

Figure 16:
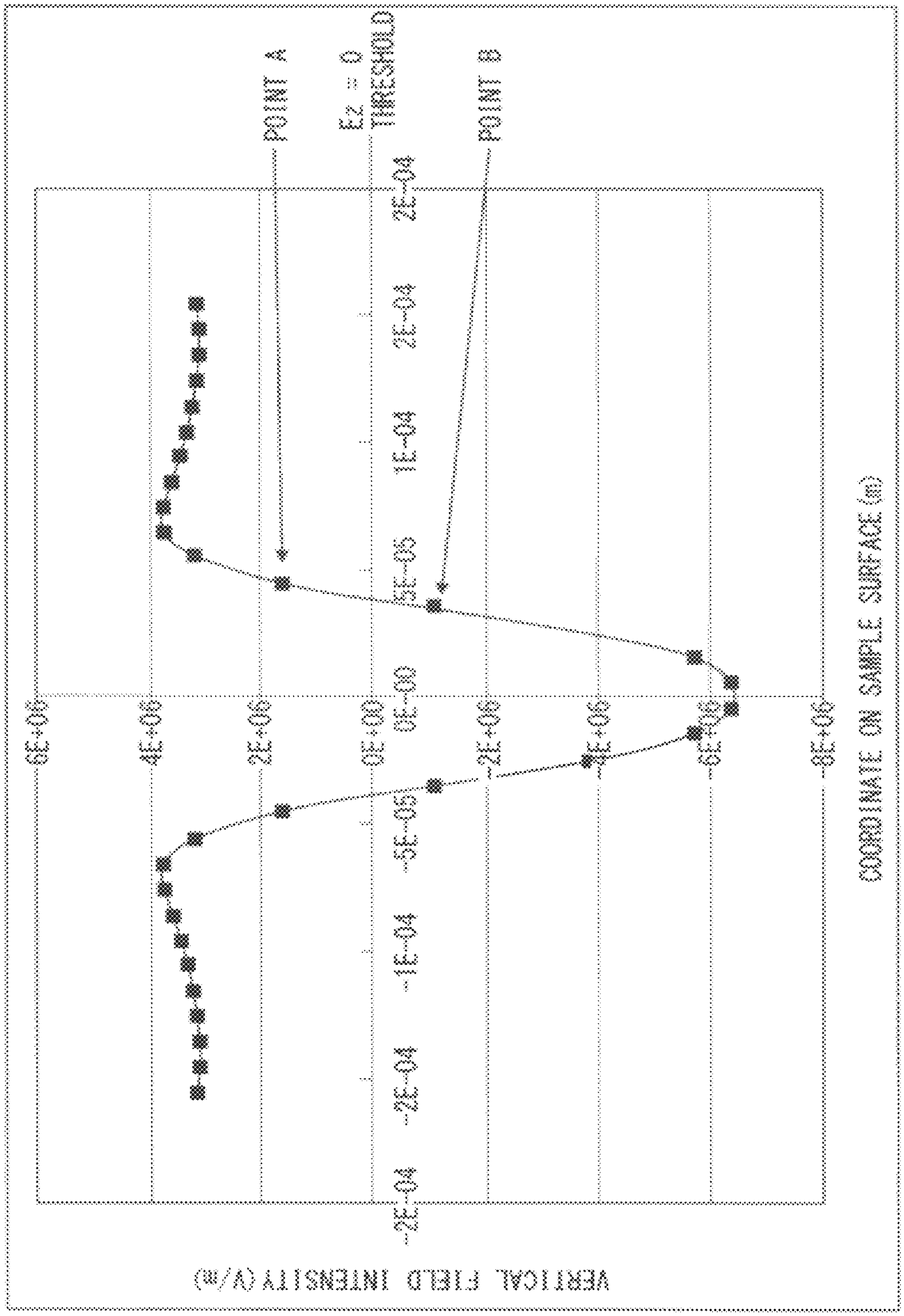
FIG. 16 is a graph showing a relation between positions on the sample and vertical electric field intensity in the respective positions.

First, as in the first and second embodiments, the electromagnetic field analysis is conducted (in step S3 in FIG. 7) using the set surface charge model (in step S2 in FIG. 7) to calculate the electric field intensity distribution on the sample surface. The coordinate as the Ez=0 threshold is derived from the electric field intensity distribution. When calculated data of the Ez=0 threshold is discrete, the coordinate can be approximately calculated by straight-line approximation of two points (points A, B in FIG. 16) immediately before and after the positive to negative inversion of the vertical electric field intensity and by bisection as shown in FIG. 16. In the following calculation of the graph in FIG. 16 is described.

The sample 23 is scanned with the electron beam and secondary electron emitted is detected by the detector 24 (scintillator). The emitted electron is converted into an electric signal to generate a contrast image for observation. The contrast image is generated since the amount of the secondary electron detected from a non-exposed portion with remnant charge is larger than that from an exposed portion. A dark portion can be considered as a latent image.

With a charge distribution in the latent image on the sample 23, electric field distribution corresponding to the surface charge distribution is formed in the space above. The secondary electron occurring from the incident electron onto the sample 23 is pushed back by the electric field so that the amount thereof reaching the detector 24 decreases. Thus, a contrast image in line with the surface charge distribution, with a black portion from the exposed portion and a white portion from the non-exposed portion can be obtained and measured.

Figure 17A:
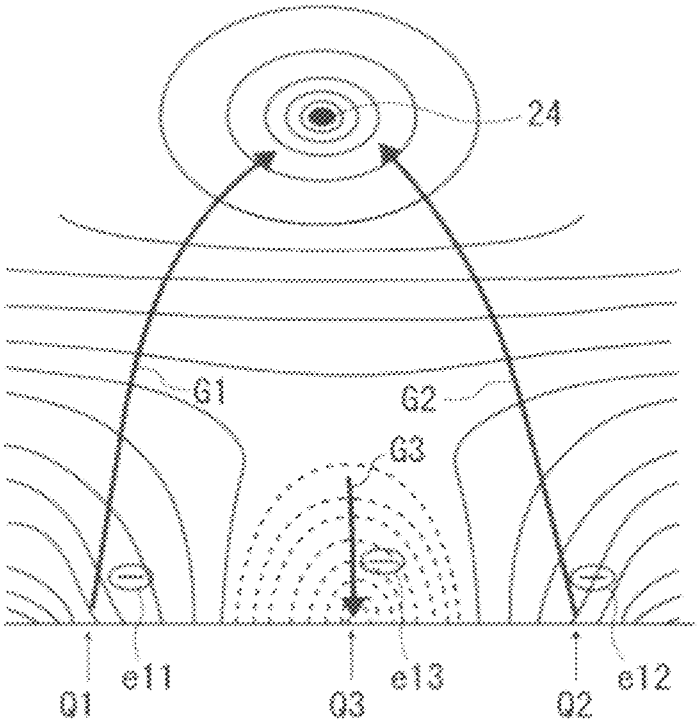
FIGS. 17A, 17B show the principle of detection of charge distribution by secondary electron.

FIG. 17A shows the potential distribution in the space between the detector 24 and the sample 23 with a contour. The sample surface except for a potential attenuated portion by optical attenuation is evenly charged with negativity. Since the detector 24 is given positive potential, the closer to the detector 24 from the sample surface a position is, the higher the potential of the position is, as shown in the solid contour.

In the drawing secondary electrons e11, e12 occurring at the points Q1, Q2 uniformly charged along the negativity of the sample are attracted onto the positive potential of the detector 24 as indicated by the arrows G1, G2 and caught by the detector 24.

Figure 17B:
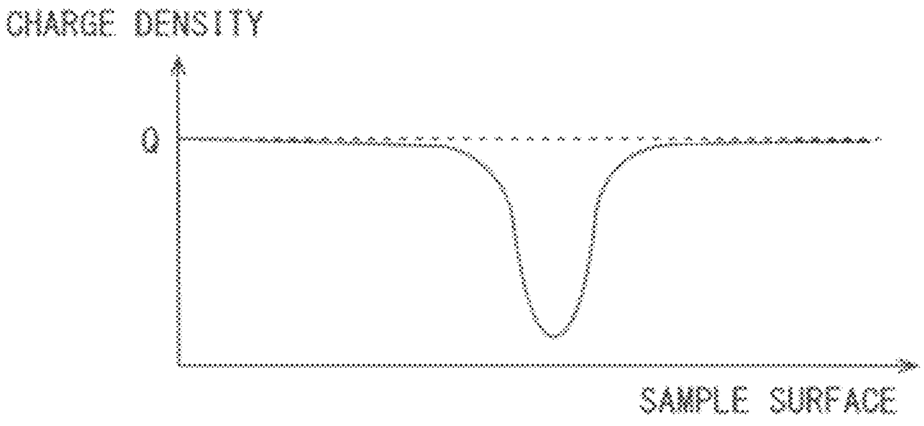

Meanwhile, FIG. 17A the potential contours near the point Q3 as the center of the negative potential attenuated portion are semielliptical. The potential distribution of the portion is such that the closer to the point Q3, the higher the potential. Therefore, electric power acts on a secondary electron e13 occurring about the point Q3 to pull it toward the sample 23 as indicated by the arrow G3, so that the secondary electron e13 is captured by a potential hole indicated by a broken contour and prevented from moving to the detector 24. FIG. 17B is a graph showing the potential hole.

In other words, with regard to the secondary electrons detected by the detector 24, a part with a larger intensity (the number of secondary electrons) corresponds to the evenly negative-charged portion of the latent image (the points Q1, Q2 in FIG. 17A) while a part with a lower intensity corresponds to the optically irradiated portion or an image portion of the latent image (the point Q3 in FIG. 17A).

By sampling an electric signal obtained by the detector 24 in FIG. 1 at a proper sampling timing, the surface potential distribution V(X, Y) can be determined for each small area associated with the sampled signal, using sampling time as a parameter. This makes it possible to represent the surface potential distribution V(X, Y) or potential contrast image as two-dimensional image data. With use of an output device, the pattern of an electric latent image can be provided as a visual image.

For example, when the intensity of the secondary electron is represented by a contrast of brightness, an image portion of an electric latent image is dark while the other portion is bright so that a contrast image in line with the surface charge distribution can be obtained. Needless to say that the surface charge distribution can be found from a known surface potential distribution.

Thus, the electric field intensity distribution in FIG. 16 is calculated from the surface potential distribution in FIG. 17 to calculate Ez=0.

Fifth Embodiment

In the present embodiment an apparent charge density on the interfaces of the conductor and dielectric is found as a direct solution. Specifically, a known electrode potential is converted to an apparent charge density using, as a boundary condition, an unknown charge density on the sample and geometric arrangement in the form of algebraic equation of the structure models of the conductor and dielectric in a space to be analyzed. The space field is directly decided from the apparent charge density, and the charge density on the sample is decided by comparing calculated electron orbit simulation data with data on the measured detection signal. Herein, the apparent charge density refers to a tentative value of charge density on the sample interface which forms an electromagnetic field equivalent to the electrode potential applied to the conductor.

That is, a coefficient matrix is obtained from the geometric arrangement in the form of algebraic equation of the conductor and dielectric in a space to be analyzed, to solve simultaneous linear equations with n-unknowns using the coefficient matrix, the field potential, the potential of the conductor and the charge density on the interface of the dielectric as a boundary condition. Details are described in the following.

Figure 8:
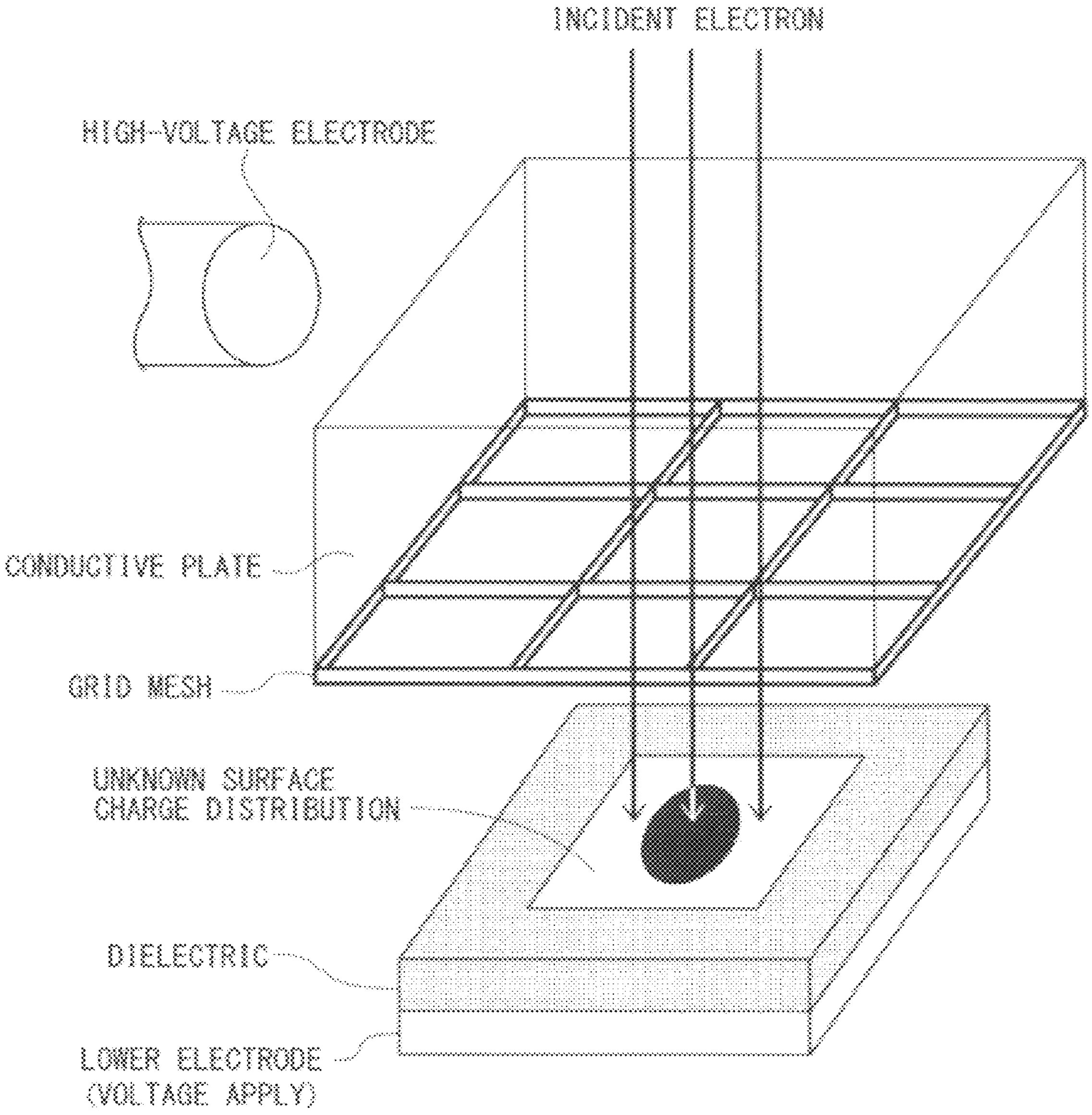
FIG. 8 shows an example of a structure model used in measuring the surface charge distribution according to one embodiment of the present invention.
Figure 9:
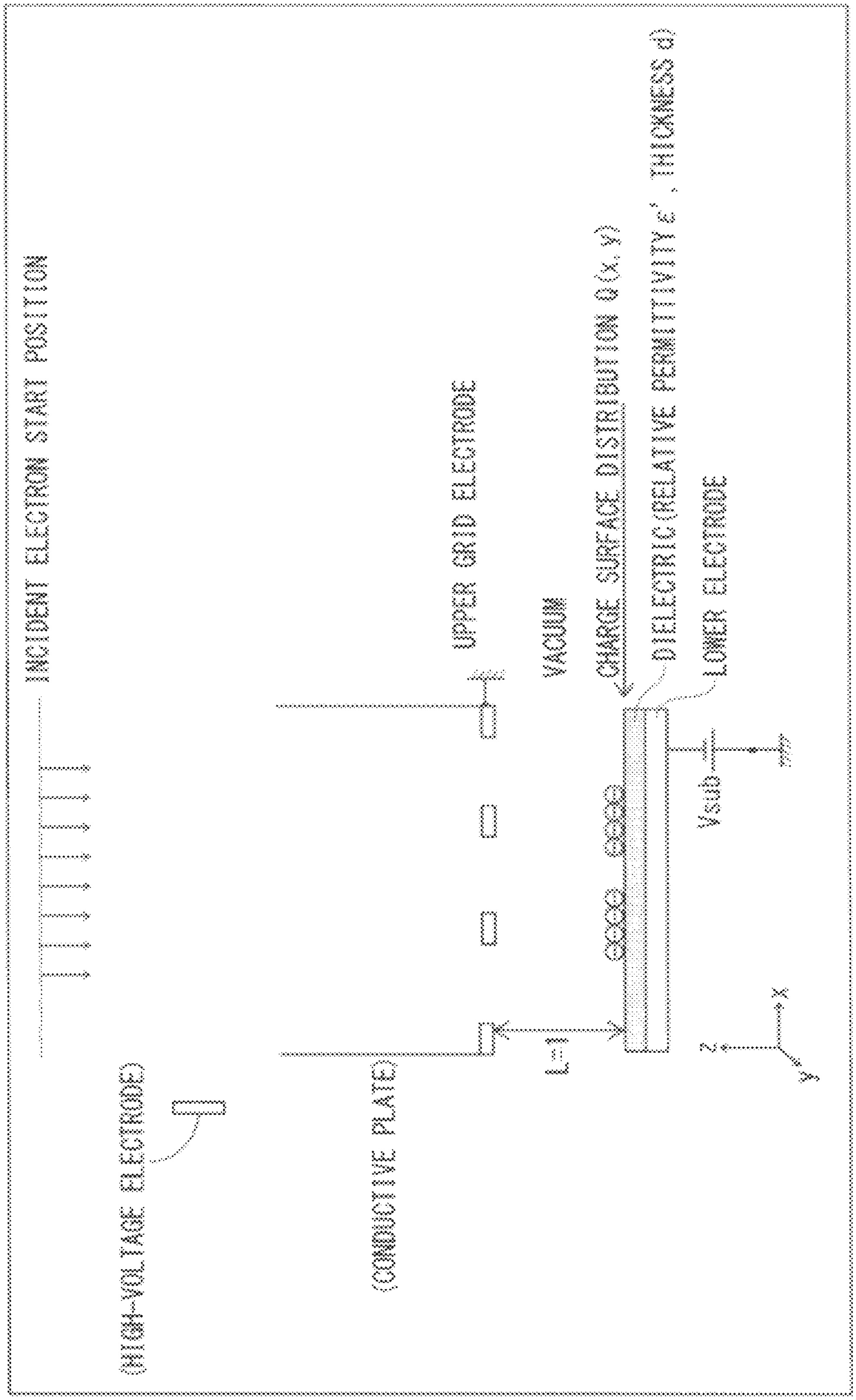
FIG. 9 is a side view of the structure mode in FIG. 8.
Figure 18:
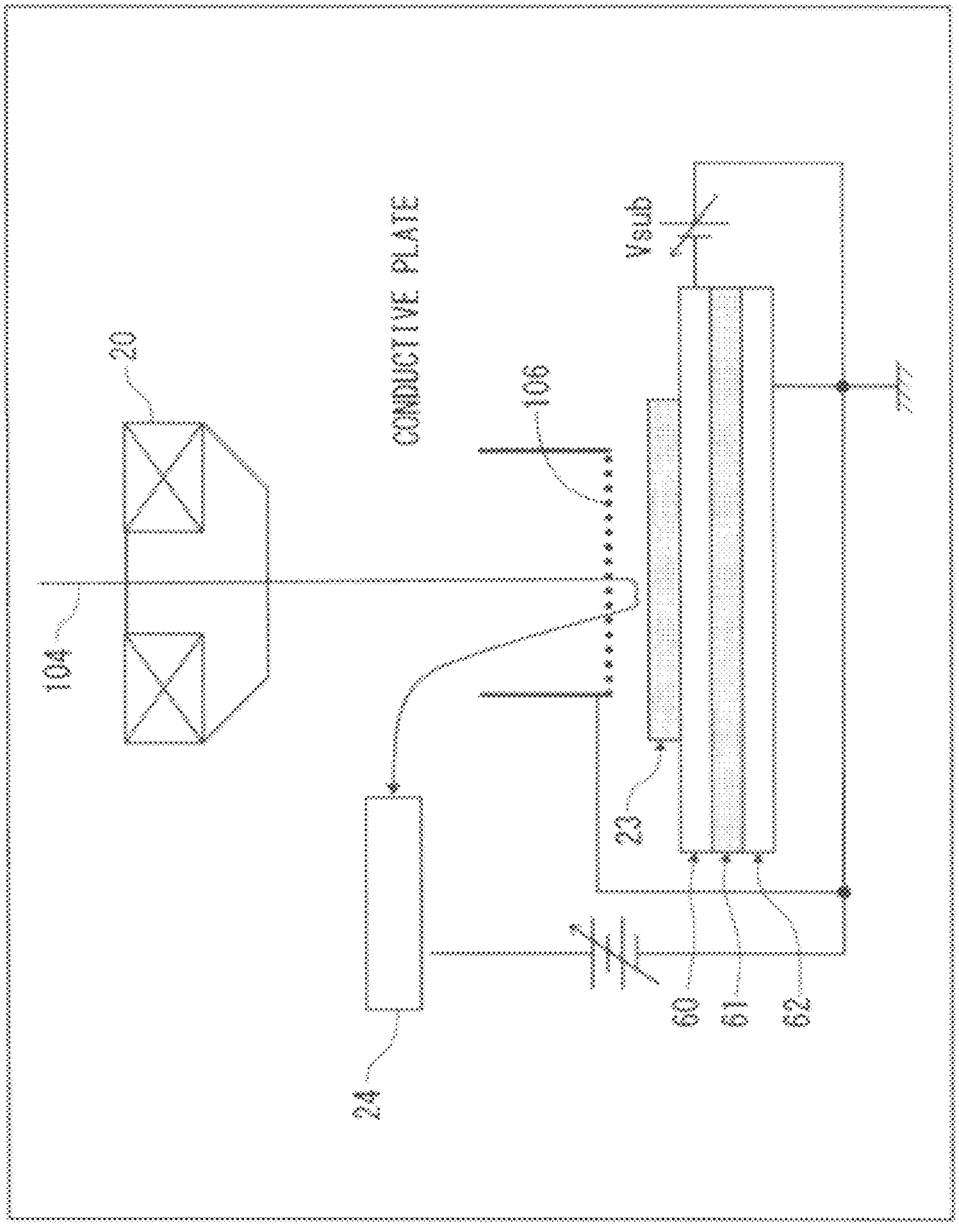
FIG. 18 shows an example of a secondary electron detector usable in the surface charge distribution measuring method and device according to one embodiment of the present invention.

First, the structure model is set (FIGS. 8-9). FIG. 18 shows a measuring device for detecting signals. In FIG. 18 the conductor 60, an insulator plate 61 and a ground substrate (GND) 62 are layered to form a mount for the sample. The sample 23 as a photoreceptor is placed on the conductor 60 applied with the voltage Vsub. An electron beam 104 is irradiated to the photoreceptor 23 from above. The objective lens 20 is disposed on the path of the electron beam 104 so as to adjust the electron beam 104 to have a properly shaped traverse section to irradiate the photoreceptor 23. A grid mesh 106 is provided above the photoreceptor 23. The detector 24 is provided obliquely above the grid mesh 106 to detect electrons of the electron beam 104 reflected by the photoreceptor 23.

The shape and film thickness of the sample or photoreceptor, shape of electrode on the back face of the sample, and the conductor and dielectric near the sample are large influential factors to the electron orbit. Therefore, these elements are geometrically arranged with the position of the detector, the structure of the electron beam optical system, and the property of the respective optical elements of the optical system taken into consideration when necessary. Then, the permittivity of the dielectric and the applied voltage to the conductor are set. The electrode potential on the back face of the sample used for the measurement is set. The elements disposed away from the sample do not affect the electron orbit much so that they can be omitted or simplified.

Then, the initial charge density distribution is set on the sample surface. It can be arbitrarily set since it is changed according to a result of comparison with measured data. However, preferably, it is set to about an expected value. The closer to the measured value it is, the shorter the optical convergence time becomes.

Figure 19A:
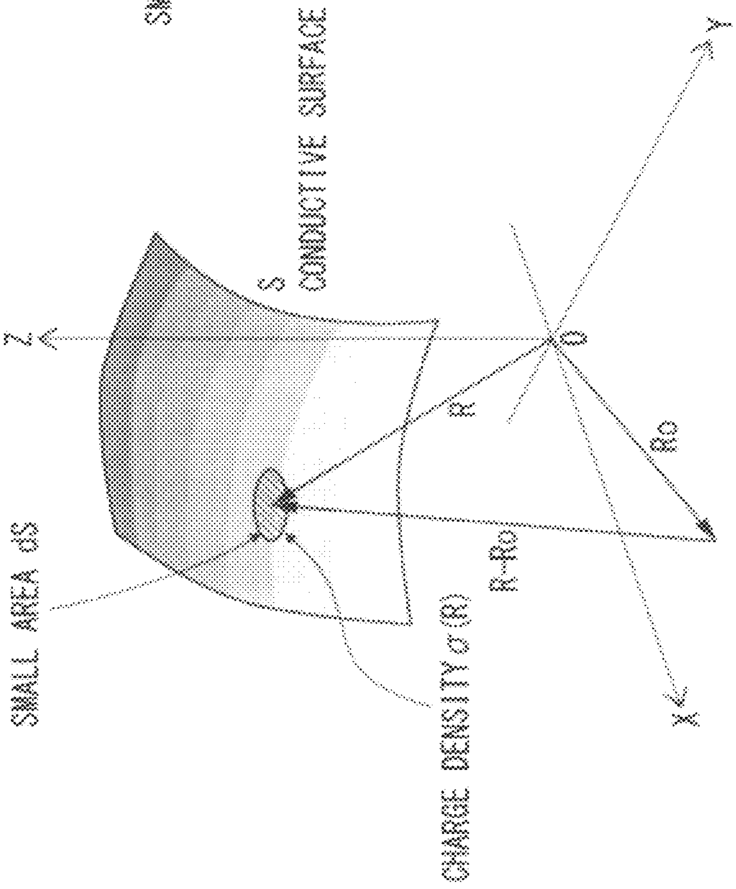
FIGS. 19A, 19B show the apparent charge density of an electrode potential in the surface charge distribution measuring method according to one embodiment of the present invention.

Next, the electrode potential given to the conductor is converted to an apparent charge density on the sample interface. With the conductor given potential at coordinate R in an XYZ space as shown in FIGS. 19A, 19B, electrostatic potential ϕ(R0) at the point R0 in the space is represented by the following expression (4):

$$\phi(\vec{R}_0) = \frac{1}{4\pi\varepsilon_0}\int\int_S \frac{\sigma(\vec{R})}{|\vec{R}-\vec{R}_0|}dS$$

where σ(R) is charge density distributed on the conductive surface S.

Figure 19B:
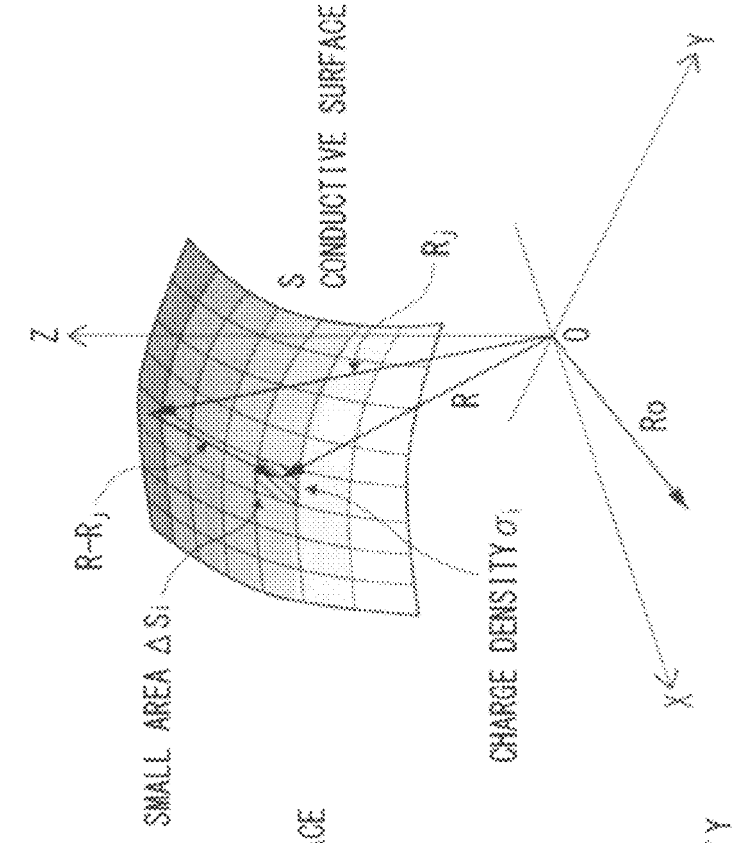

A boundary area is divided into small areas ΔSi as shown in FIG. 19B. The charge density in the small areas is approximately set to σi which is constant. The electrostatic potential ϕ (Rj) at the point Rj in the space is represented by the following expression (5):

$$\phi(\vec{R}_j) = \sum_{i=1}^{n}\frac{\sigma_i}{4\pi\varepsilon_0}\int\int_{\Delta Si}\frac{1}{|\vec{R}-\vec{R}_j|}dS$$

Figures 20A, 20B, 20C:
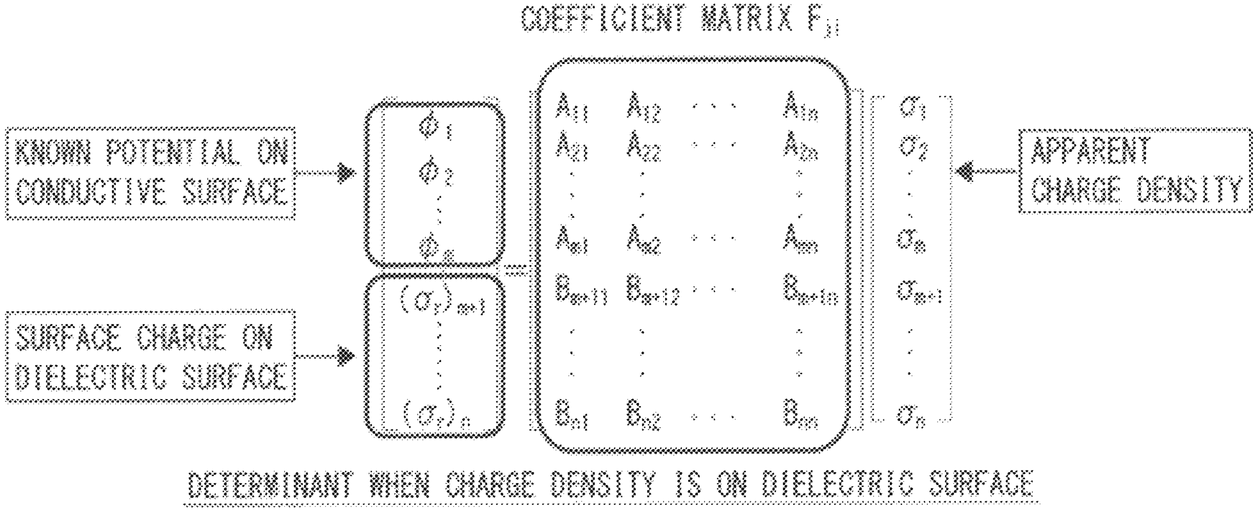
FIGS. 20A to 20C show a coefficient matrix used in the surface charge distribution measuring method according to one embodiment of the present invention.

A relation between a known electrode potential and the apparent charge density is expressed by a determinant shown in FIG. 20A. Among the left-hand side of the determinant ϕl to ϕm are known potentials on the conductor face and σr is surface charge density to be measured and values are input before the comparison. Thus, the left-hand side of the determinant is known. σ in the right-hand side is apparent charge density and σl to σm are apparent charge densities on the conductor face.

The coefficient matrix Fji as elements of coefficient determinant is determined by equations shown in FIGS. 20A, 20B from the geometrical arrangement of the conductor and dielectric in the space to be analyzed. In the equations, Rj is coordinate (xj, yj, zj), δ is a sampling point at Rj on the conductor or dielectric surface, ji is Kronecker delta, nj is normal vector of an element j, ∈0 is vacuum permittivity, ∈1 is permittivity outside the dielectric interface, and ∈2 is permittivity inside the dielectric interface.

Figure 21:
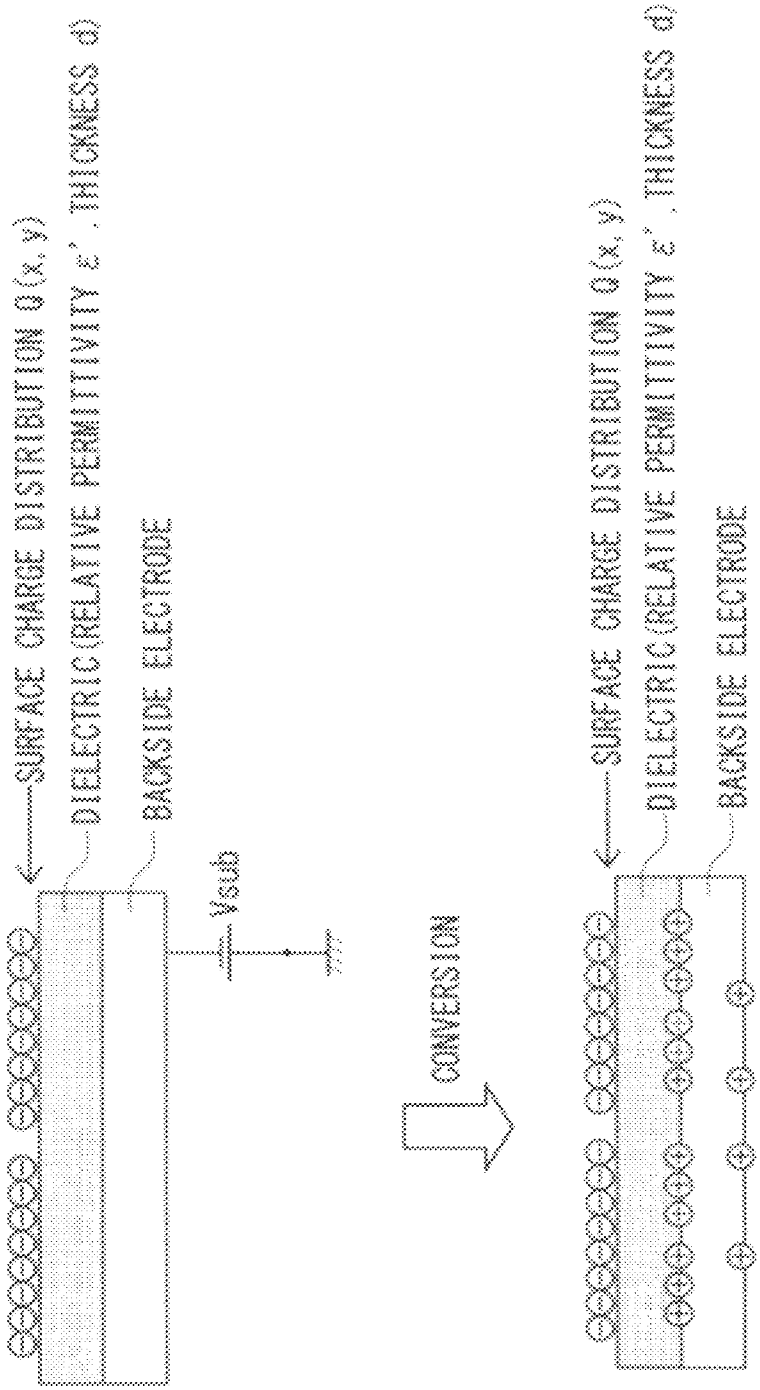
FIG. 21 illustrates the conversion of the apparent charge density of the conductor in the surface charge distribution measuring method according to one embodiment of the present invention.
Figure 22A:
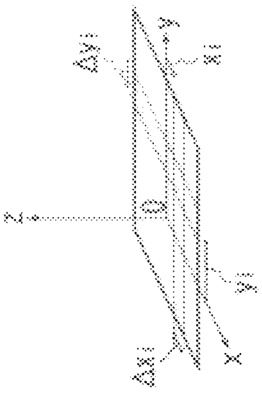
FIGS. 22A to 22F show basic faces of the structure model according to one embodiment of the present invention.
Figure 22B:
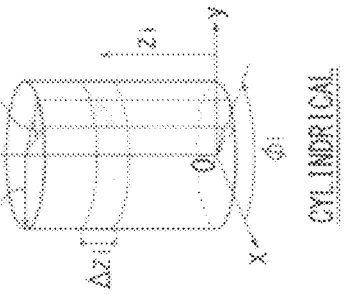
Figure 22C:
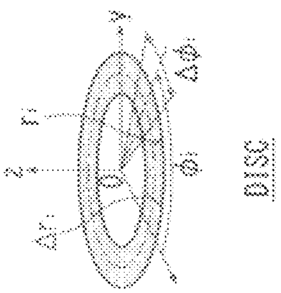
Figure 22D:
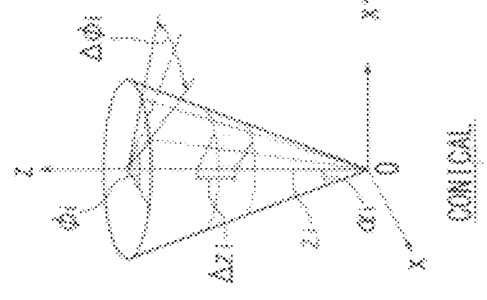
Figure 22E:
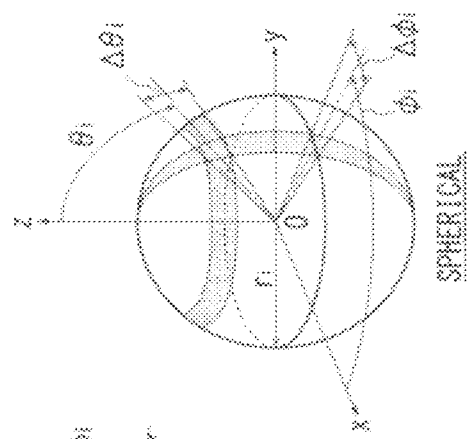
Figure 22F:
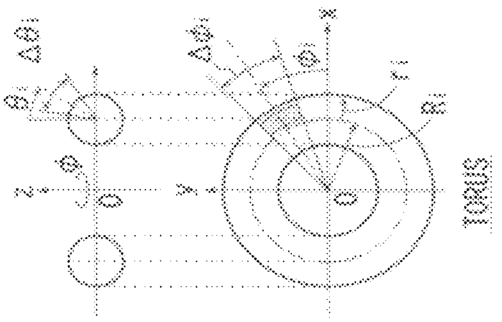

Thus, the apparent charge density can be found by determining the coefficient matrix Fji and solving the determinant by simultaneous linear equations or inverse matrix calculation using the coefficient matrix, the potential of the conductor and the charge density on the dielectric interface for the boundary condition. In this manner the known electrode potentials ϕl to ϕm and the surface charges (σr) m+1 to (σr)n can be converted to apparent charge densities σl to σm and σm+1 to σn, respectively, as shown in FIG. 21A.

The structure model can be represented by one or a combination of a part or all of six basic model faces of flat, cylindrical, disc, conical, spherical, and torus shown in FIGS. 22A to 22F, respectively. The basic model faces, the five rotationally symmetrical faces and the flat face represented in the two-dimensional space are expressed by a function of a local coordinate system associated with the basic models. The integrand thereof can be a relatively simple equation.

By representing the structure model by the six basic model faces, at least one of double integration is calculated analytically by the determinant shown in FIG. 20B. This determinant is a double integration so that calculation thereof requires enormous amount of time.

Conventionally, double integration Fji is directly calculated by numerical integration. By representing the structure model by the six basic model faces, a first integration can be analytically done. Specifically, the coefficient matrix Aji for the flat face can be expressed in the form including log by the following equations (6) to (9).

$$Aji = \frac{1}{4\pi\varepsilon_0}\times \int_{-\frac{\Delta yi}{2}}^{\frac{\Delta yi}{2}}\log\left[1+\frac{\Delta x_i + P}{\left(x_i-\frac{\Delta x_i}{2}\right)-x_j+\sqrt{C+\left\{\left(x_i-\frac{\Delta x_i}{2}\right)-x_j\right\}^2}}\right]dy \tag{6}$$

$$C = \{y_j-(y_i+y)\}^2+z_j^2 \tag{7}$$

$$P = \frac{2\Delta x_i(x_i-x_j)}{\sqrt{C+\left\{\left(x_i+\frac{\Delta x_i}{2}\right)-x_j\right\}^2}+\sqrt{C+\left\{\left(x_i-\frac{\Delta x_i}{2}\right)-x_j\right\}^2}} \tag{8}$$

$$\Delta S_i = \Delta x_i \times \Delta y_i \tag{9}$$

Similarly, the cylindrical, conical and disc faces are expressed in the form including log and the spherical and torus faces are expressed in the form including incomplete elliptic integral of the first kind. A first integration in the coefficient matrix Bji in FIG. 20C can be analytically calculated by the following equation (10):

$$F_{ji}=\int F(y)dy$$

The first integration of the double integration is analytically calculated and only the other integration is calculated by numerical integration. Thus, it is able to greatly reduce the amount of calculation time for the coefficient matrix Fji.

Sixth Embodiment

The surface charge distribution measuring method according to a sixth embodiment is configured to correct the surface charge distribution on the sample calculated in any of the above embodiments by using a threshold potential Vth (x, y) indicating a state of the charge distribution of the sample, and to find more accurate surface charge distribution. In the following only the correction of the surface charge distribution is described. The preceding steps of calculating the surface charge distribution are the same as in the above embodiments; therefore, a description thereof is omitted.

The threshold potential Vth is expressed by the following equation:

$$Vth=Vacc-Vsub$$

where Vacc is the accelerated voltage of the electron beam and Vsub is a voltage applied to the conductor. Vth (x, y) represents a value of the threshold potential Vth at coordinate (x, y).

Figure 23A:
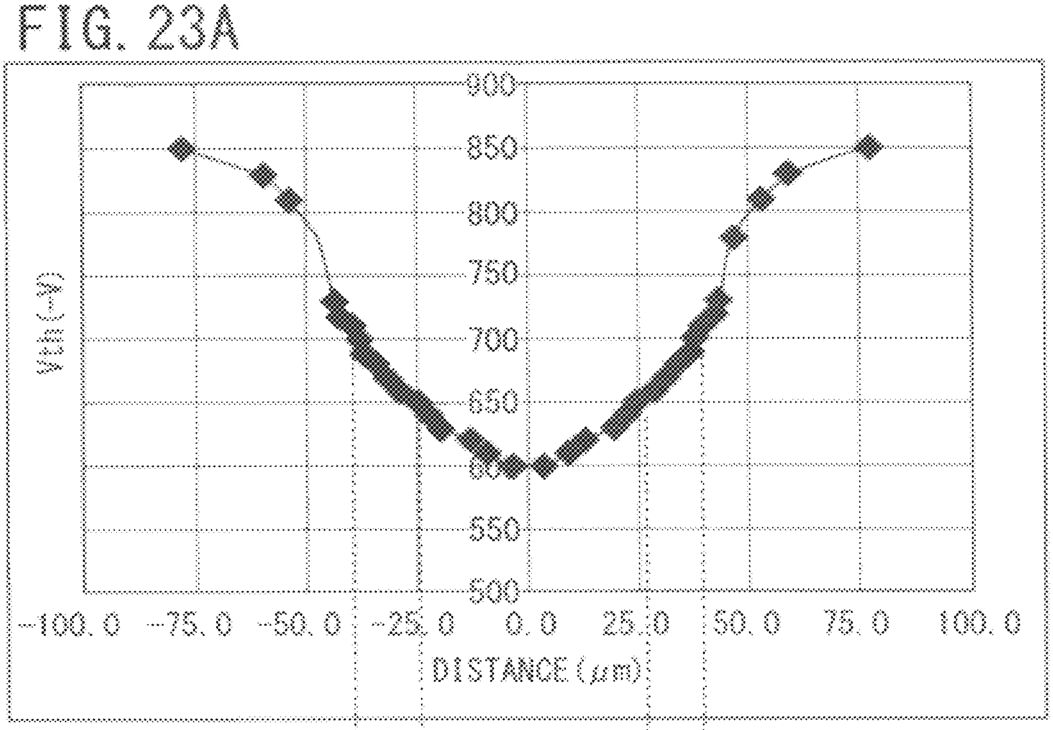
FIGS. 23A to 23C show a relation between the intensity of a detection signal of when the sample is two-dimensionally scanned and a threshold potential Vth.
Figure 23B:
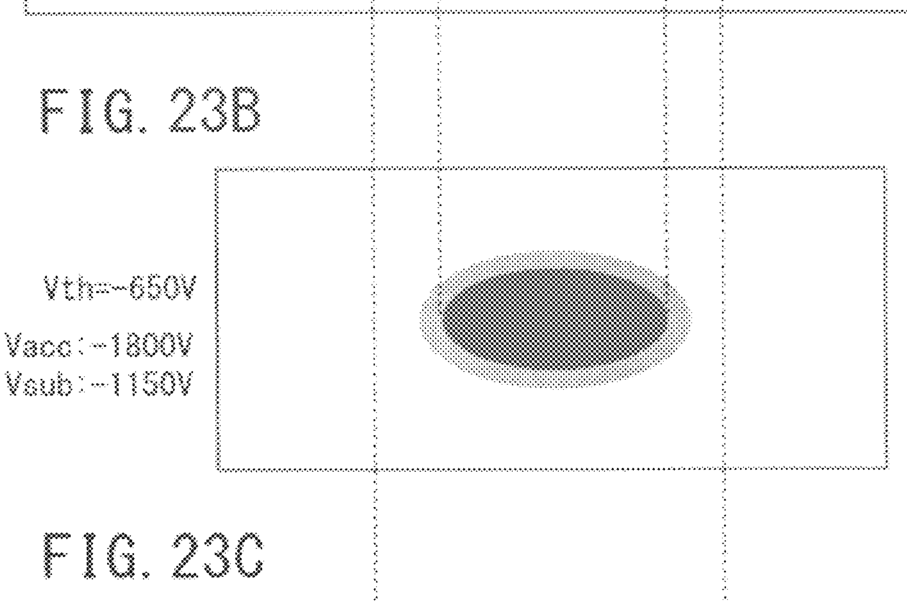
Figure 23C:
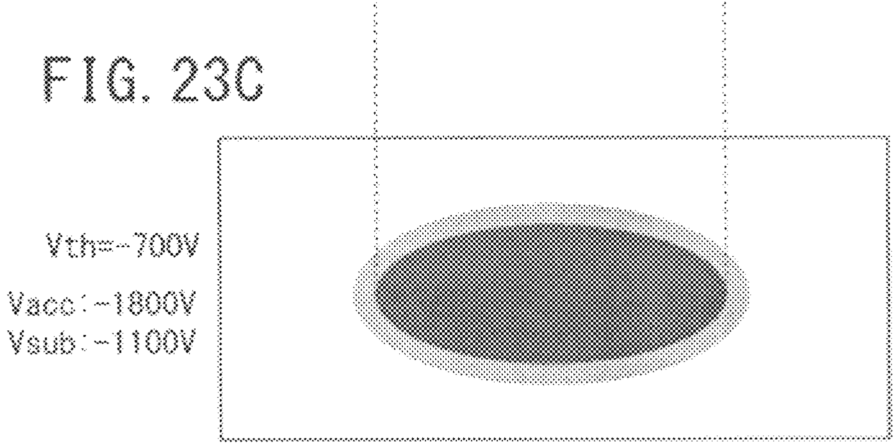

First, how to find the Vth (x, y) by measurement is described. FIGS. 23A to 23C show results of measurement of the Vth (x, y) by signal detection. The accelerated voltage of the electron gun two-dimensionally scanning is set to −1,800V. The curve in FIG. 23A indicates the results of detection of the threshold potential distribution caused by the surface charge distribution of the sample. The value of the threshold potential Vth at the center of the curve (x=y=0) is about −600V. This means that at the applied voltage Vsub being −1,200V, the landing energy of the center is almost zero.

From the center of the curve to the outside, the value of the threshold potential Vth negatively increases and it is about −850V in a periphery area beyond a radius 75 μm from the center. The ellipse shown in FIG. 23B is an imaged output of the detector when the voltage Vsub of the back face of the sample is set to −1,150V. The threshold potential Vth is −650V (Vacc−Vsub). The ellipse in the FIG. 23C is the same when the voltage Vsub is set to −1,100V. The threshold potential Vth is −700V.

In FIGS. 23B, 23C the dark and light portions represent a difference in the intensity of the detection signal. The amount of detection signal in the light portion is larger than that in the dark portion. That is, the light portion is an area in which the incident electron is inverted before reaching the sample while the dark portion is an area in which the incident electron has reached the sample. The boundary between the light and dark portions indicates that the landing energy is almost zero there.

A value of the boundary between the light and dark portions is defined to be the value of the threshold potential Vth. The sample surface is repetitively scanned with the electron beam while the accelerated voltage Vacc or applied voltage Vsub is changed, to measure the threshold potential Vth (x, y) in micron scale.

Figure 25:
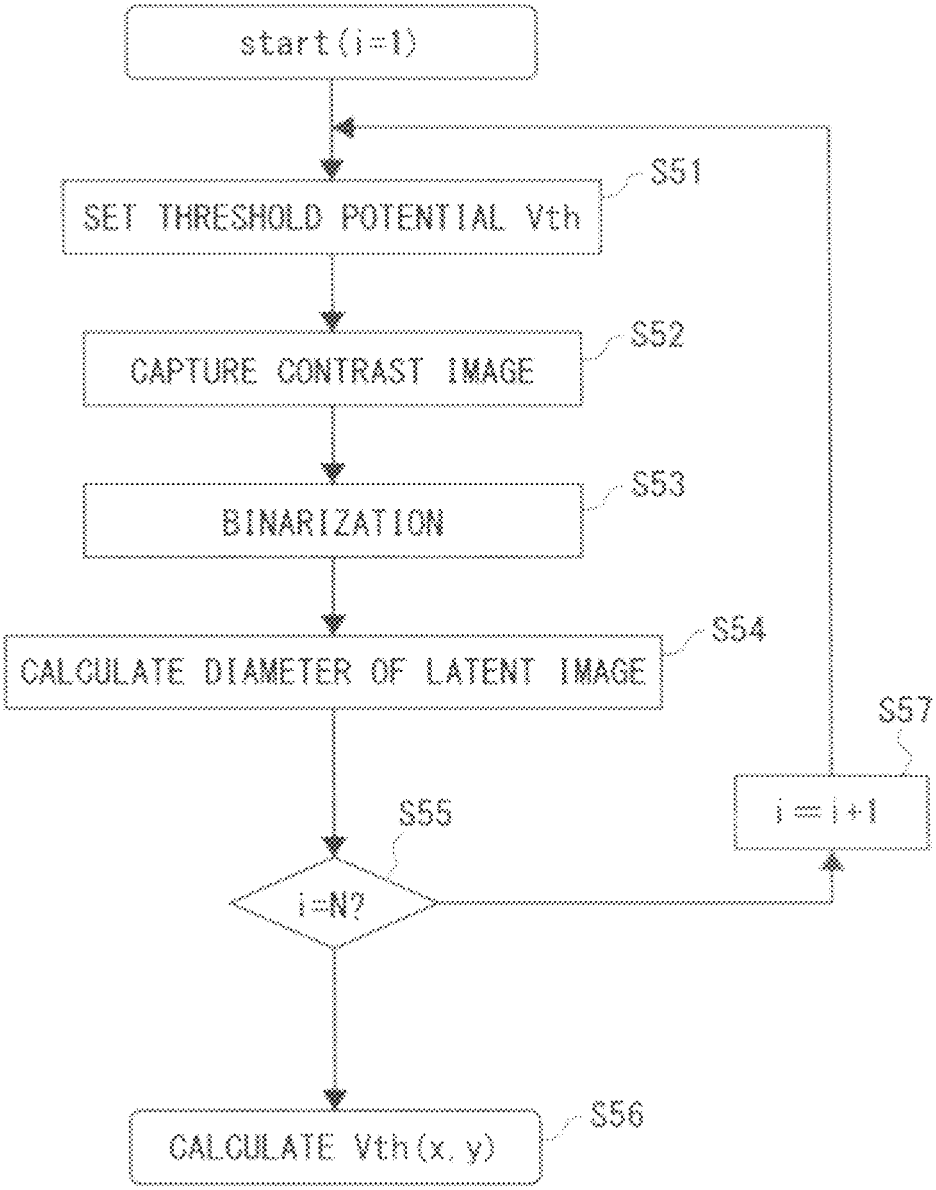
FIG. 25 is a flowchart for calculating the threshold potential Vth indicating the charge distribution of the sample.

FIG. 25 is a flowchart for measuring the threshold potential Vth (x, y) by the signal detection. In step S51, the threshold potential Vth is set, and in step S52 a contrast image is captured. In step S53 the contrast image is binarized and in step S54 the latent image diameter is calculated. The steps 51 to 54 are then repeated at a predetermined number of times (steps S55, S57) to calculate the threshold potential Vth (x, y) in step S56.

Next, how to find the threshold potential Vth (x, y) by simulation is described. A primary charged particle is incident on the sample at the accelerated voltage Vacc (<0) from the initial coordinate with a distance z0 away from the sample surface. This simulation is such that with the voltage Vsub applied to the back face of the sample, a determination is made on whether the primary charged particle reaches or is inverted before reaching the sample to decide the initial coordinate (x0, y0, z0) as the branching point and set the threshold potential Vth (x0, y0) to the value of Vacc−Vsub.

The structure model in FIGS. 8, 9 and an unknown surface charge are set to calculate the orbit of the primary charged particle. The applied voltage to the back face of the sample is Vsub.

In the present embodiment the electron is used for the primary charged particle. It is set to be vertically incident on the sample from a distance z0 away from the sample surface. It is preferable to set the distance z0 to be further than that from the upper grid to the sample. The incident electron is given the initial coordinate and the accelerated voltage Vacc (<0) or the initial velocity equivalent to the accelerated voltage Vacc.

Although whether or not the orbit of the incident electron has reached the detector can be analyzed, it increases a length of time for the calculation. The accuracy of the analysis by determining whether the incident electron has reached the sample is sufficiently high.

Thus, it is able to calculate by simulation the threshold potential Vth (x, y) as the branching point equivalent to that obtained from the detection signal.

Figure 24A:
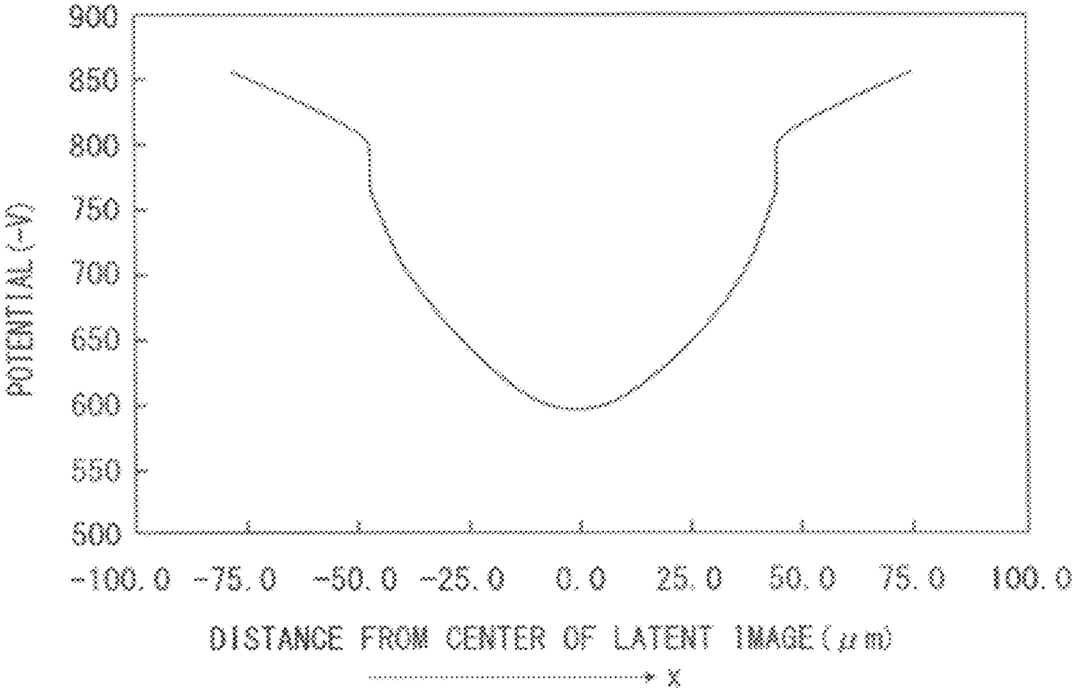
FIGS. 24A, 24B are graphs showing an example of the potential relative to a distance from the center of a latent image.
Figure 24B:
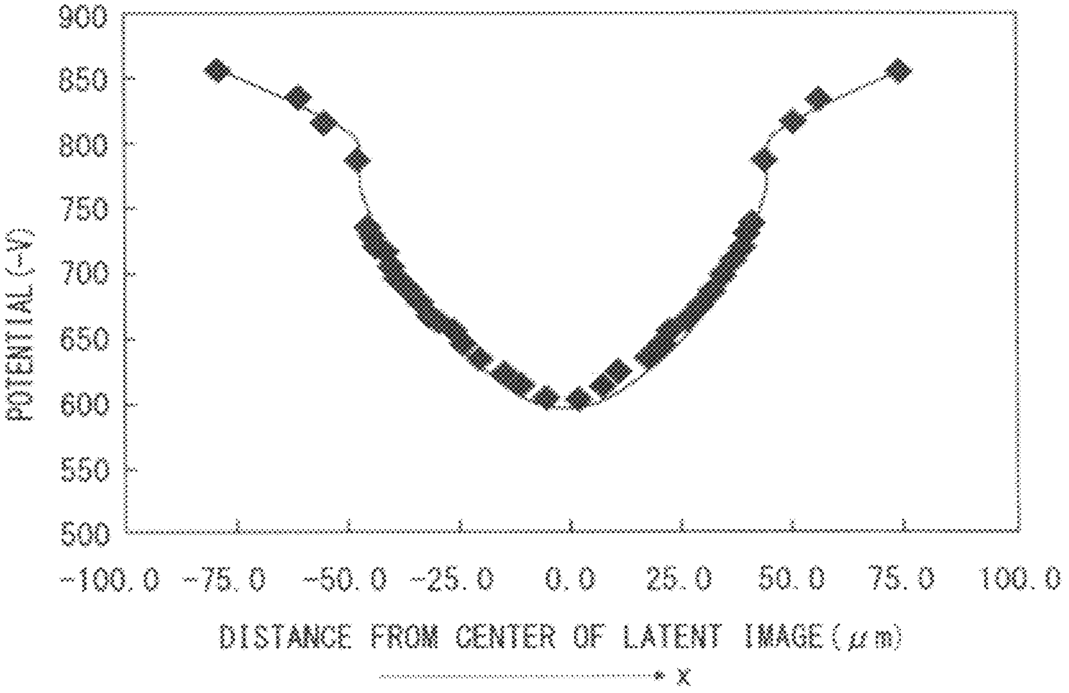

In the following, for the sake of expedience, the threshold potential Vth (x, y) by calculation is referred to as Vth_s (x, y) while that by simulation is referred to as Vth_m (x, y). FIG. 24A shows a relation between surface potential calculated in X-axis direction and scan position by way of example, to compare Vth_s (x, y) and Vth_m (x, y) and find if they are equal to each other. They can be compared by calculating a difference Δ (*x, y*) between them. FIG. 24B shows the measured surface potential and the calculated surface potential overlapping with each other by way of example.

Next, a determination is made on whether or not the difference Δ (*x, y*) is equal to or lower than a preset evaluation value M. For example, a minimal Vth_m (x, y) can be selected by finding the differences among all the Vth_m (x, y). The evaluation value M can be a squared sum of the differences obtained by the following equation:

$$M=\Sigma(Vth\_s)(x,y)-Vth\_m(x,y))\hat{}2$$

When the difference Δ (*x, y*) is over the value M, the charge distribution model is corrected in accordance with the value of the Δ (*x, y*). For example, if the difference Δ (*x, y*) includes a bias component, the average potential is determined to be different so that the bias component is added to each potential of the charge distribution model. Further, if the difference Δ (*x, y*) is of uneven shape, the shape of surface charge distribution, for example, depth and width is determined to be different so that the shape of the charge distribution model is corrected to be the uneven shape. Thereby, a more appropriate charge distribution model is obtainable.

Until the result of the comparison becomes positive, the above process is repeated. Thereby, an unknown charge is decided.

Thus, the surface charge is determined by calculating the electron orbit and comparing it with the measured result. To measure the surface potential, a static electric field is decided from a known charge distribution. By analyzing the static electric field by Poisson equation or else, physical quantities such as potential distribution V(x, y), electric field intensity can be measured.

Figure 26:
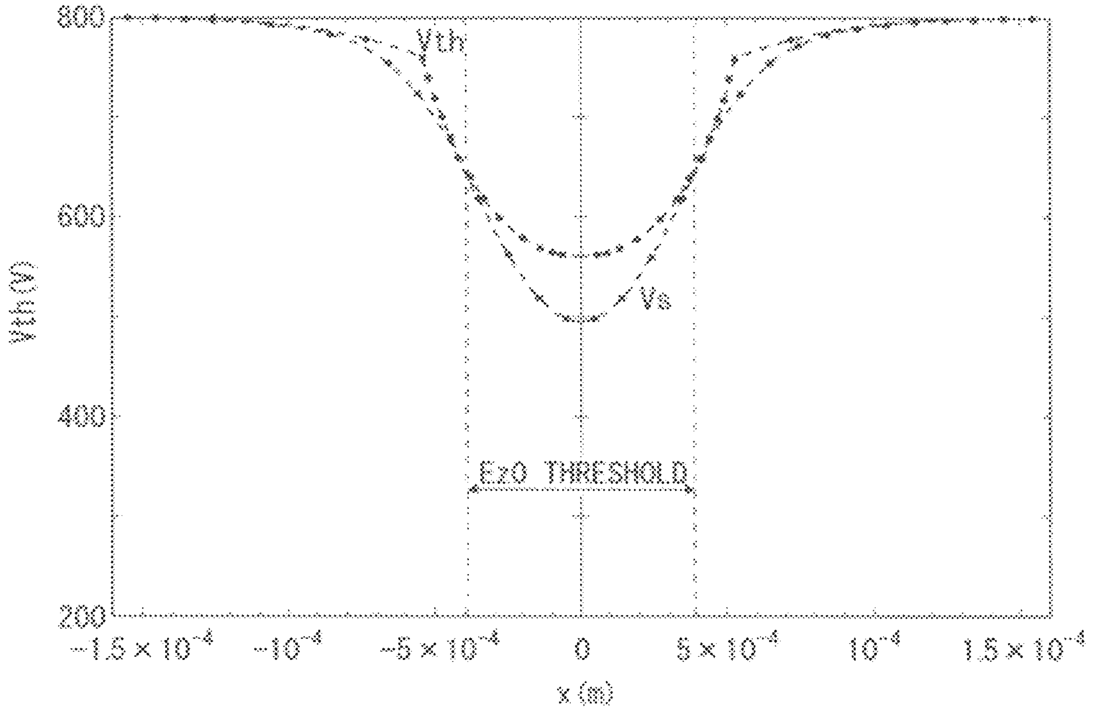
FIG. 26 is a graph showing a relation between measured values of the surface potential Vs and threshold potential Vth of the sample.

FIG. 26 shows distribution data on the threshold potential Vth and data on the surface charge distribution Vs calculated from the final charge density distribution on the dielectric surface. Between them there are an error of 2V or less in potential depth and an error of 1 μm or less in charge dispersion. Further, it is seen from FIG. 26 that the Vth distribution Vth (x, y) is inside the surface charge distribution Vs (x, y). That is, a relation, Vs (x, y)−Vth (x, y)≥0 is satisfied. Thus, the surface charge distribution corrected according to the value of threshold potential Vth (x, y) measured or calculated is highly accurate.

Seventh Embodiment

The surface charge distribution measuring method according to the present embodiment is configured to correct the surface charge distribution calculated in any of the above embodiments by electron orbit analysis, to find more accurate surface charge distribution.

The electron orbit can be calculated on the basis of electric field at an arbitrary point in a space which can be found by surface integral of the conductor and sample interface using the apparent charge density described in the fifth embodiment. That is, the surface charge distribution can be corrected by the electron orbit analysis on the basis of the apparent charge density.

The electric field intensity is represented by the following general expression (11):

$$E = \frac{\sigma}{4\pi\varepsilon_0 r^2}$$

The space field E is obtained by surface integral of the apparent charge density of each small area of the sample. Then, the electron orbit can be calculated with high accuracy by solving an equation of motion of charged particle, F=qE based on the value of space field E.

Figure 27:
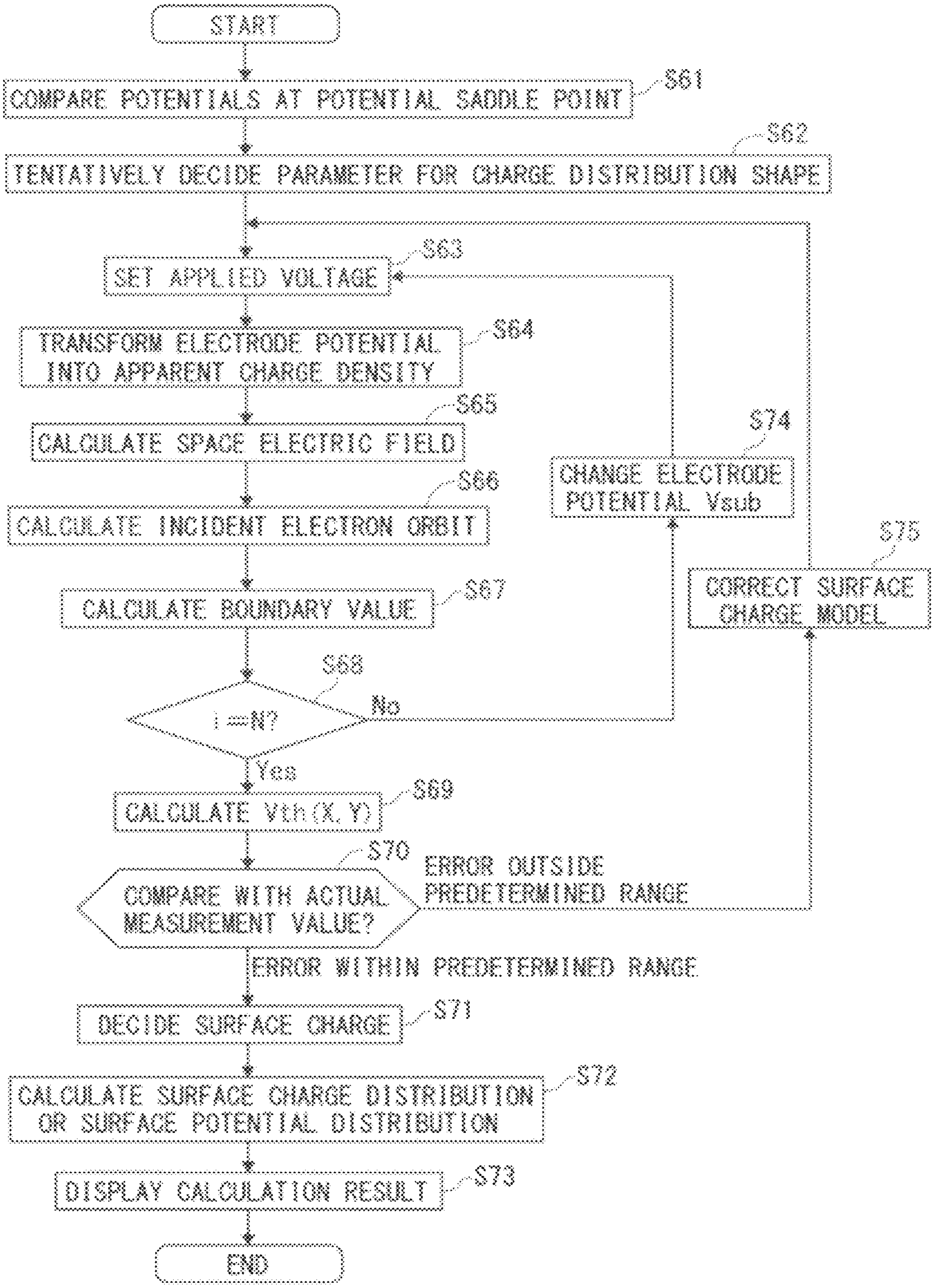
FIG. 27 is a flowchart for measuring the surface charge distribution according to a seventh embodiment of the present invention.

Next, the measured value of the detection signal obtained by the detector 24 when the electron beam is actually irradiated and a calculated value thereof by the electron orbit analysis are compared. The calculated surface charge distribution is estimated to be the actual charge distribution when the measured value and the calculated value coincide with each other or a difference therebetween is within an allowable range. When the difference is outside the allowable range, the apparent charge density is calculated again to correct the surface charge distribution. This series of processes which are shown in FIG. 27 are repeated until the difference falls within the allowable range. With reference to FIG. 27, the surface charge distribution measuring method according to the present embodiment is described in detail. Note that before the first step S61 in FIG. 27, the steps S1 to S6 and S11 in FIG. 7 are performed but omitted therefrom. The flowchart starts at step S61 equivalent to step S7 in FIG. 7.

In step S61 a measured potential Vsd1 and a calculated potential Vsd1_*s* at the potential saddle point are compared (step S7 in FIG. 7).

In step S62 the parameters for the shape of charge distribution such as shape, film thickness of the sample as a photoreceptor, and shape of electrode on the back face of the sample are tentatively decided and substituted into the coefficient matrix in FIG. 20 (see fifth embodiment).

In step S63 the applied voltage Vsub is set and applied to the conductor 60 on which the sample is placed (see fifth embodiment).

In step S64 a known electrode potential is converted into the apparent charge density using, as a boundary condition, an unknown charge density on the sample and the geometric arrangement in the form of algebraic equation of the structure models of the conductor and dielectric in a space to be analyzed (see fifth embodiment).

In step S65 the space field is calculated using the apparent charge density (see fifth embodiment).

In step S66 the orbit of an incident electron on the sample is analyzed according to the apparent charge density (see fifth embodiment).

In step S67 a value of the branching point for allowing the electron to reach or not to reach the sample is found using the result of the electron orbit analysis (see sixth embodiment). Specifically, a primary charged particle is incident on the sample at the accelerated voltage Vacc (<0) from the initial coordinate with a distance z0 away from the sample surface. This simulation is such that the voltage Vsub is applied to the back face of the sample, and a determination is made on whether the orbit of the primary charged particle reaches or is inverted before reaching the sample to decide the initial coordinate (x0, y0, z0).

In step S68 a determination is made on whether or not the number of times i at which the steps S63 to S69 are repeated is a predetermined number N. The simulation is repeated at a required number of times while the values of Vsub and Vacc equivalent to later-described measured values are changed when necessary. When the repetition number i is not the predetermined number N, the flow proceeds to step S74 to change the applied voltage Vsub and returns to step S63. When the repetition number i is the predetermined number N, the flow proceeds to step S69.

In step S69 the Vth (x, y) is calculated by the equation, Vth (x0, y0)=Vacc−Vsub as in the sixth embodiment.

Although not shown in FIG. 27, a value Vth_m (x, y) is also measured aside from the value Vth_s (x, y) calculated in step S69 as in the sixth embodiment. The calculated value Vth_s (x, y) and measured value Vth_m (x, y) are compared to find if they match each other in step S70, as in the sixth embodiment. When they do not match each other, the surface charge distribution model is corrected in step S75 and the series of steps from S63 is performed again. When they match, the flow proceeds to step S71.

In step S71 the tentatively decided parameters in step S62 are determined to be correct, and the shape of the surface charge is decided according to the parameters.

In step S72 the surface charge distribution is calculated according to the decided shape of surface charge. Also, a static electric field is decided from the charge distribution. By analyzing the static electric field by Poisson equation or else, physical quantities such as potential distribution, electric field intensity distribution can be also measured.

In step S73 the result of the calculation is displayed on a not-shown display of the surface charge distribution measuring device, completing the entire flow.

Figure 28:
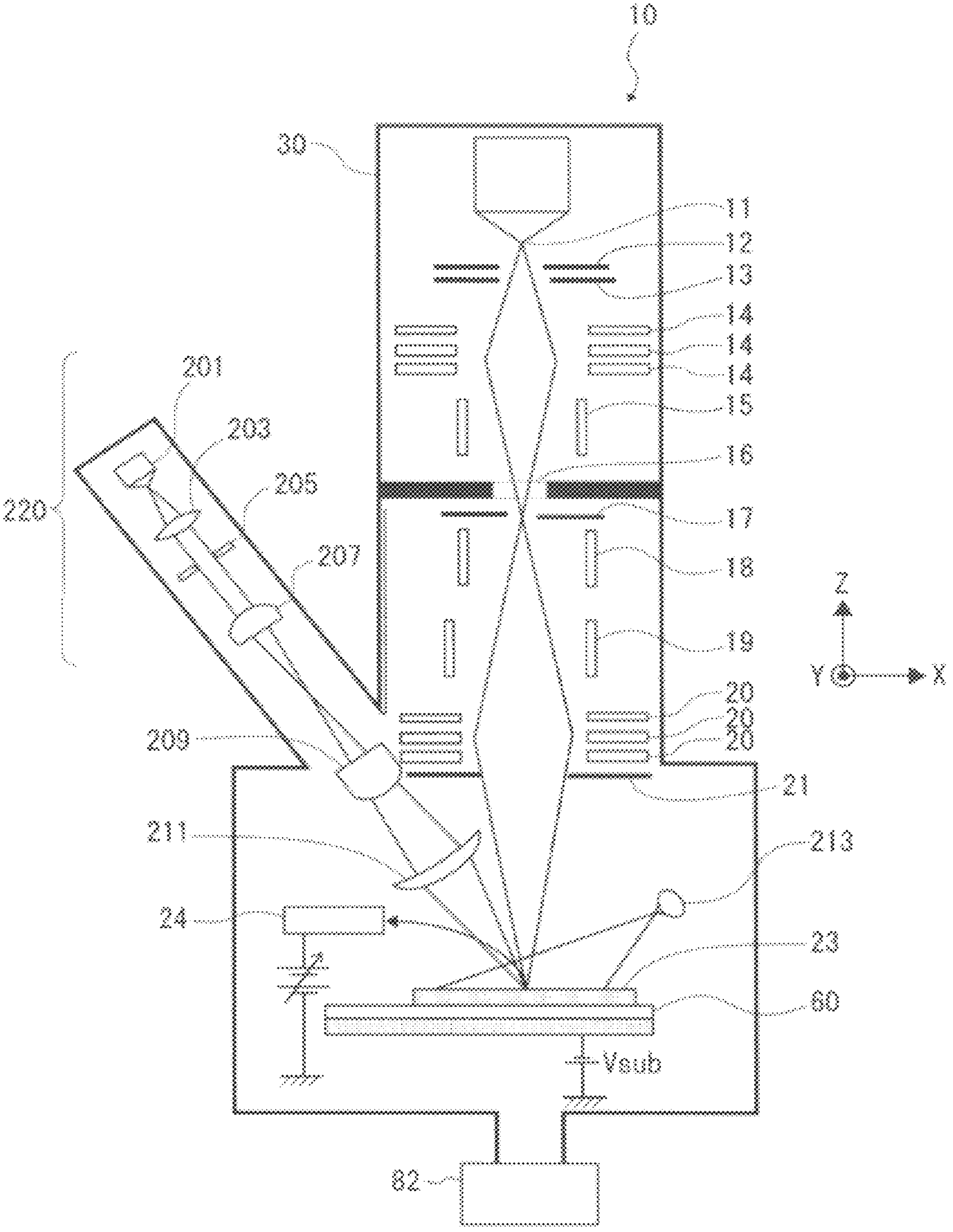
FIG. 28 shows another example of the surface charge distribution measuring device according to one embodiment of the present invention.

FIG. 28 shows another example of a surface charge distribution measuring device with a function to generate a latent image. In FIG. 28 an electrophotographic photoreceptor is used for the sample 23. An organic photoreceptor (OPC) includes a charge generating layer (CGL) and a charge transport layer (CTL) superimposed on a conductive support element. Exposed while surface charges are electrified, a charge generating material (CGM) of the charge generating layer absorbs light and generates both positive and negative charge carriers. One of the carriers is injected by electric field into the charge transport layer and the other is into the conductive support element. The carrier in the charge transport layer moves to the surface by electric field, and is coupled with the charge on the photoreceptor surface and disappears. Thereby, a charge distribution or an electric latent image is formed on the photoreceptor surface.

A surface charge distribution measuring device 10 is comprised of a pattern forming unit 220 in addition to the surface charge distribution measuring device 1 in any of the above embodiments. FIG. 28 omits to show a control system. The pattern forming unit 220 comprises a semiconductor laser 201 with a wavelength of 400 nm to 1,000 nm to which the photoreceptor is sensitive, a collimate lens 203, an aperture 205, and three imaging lenses 207, 209, 211. Also, an LED 213 is placed in the vicinity of the sample 23 to electrically neutralize the sample surface. The pattern forming unit 220 and the LED 213 are controlled by a not-shown control system.

Latent image generation of the surface charge distribution measuring device 10 is simply described. First, the surface of the photoreceptor is evenly charged. Here, the accelerated voltage is set to a higher voltage than one at which a secondary electron emission ratio becomes 1 so that the amount of incident electron exceeds the amount of emitted electron. Because of this, the electron is accumulated on the sample and charge up occurs thereon. As a result, the sample is negatively charged. However, the sample can be charged with a desirable potential by controlling the accelerated voltage and light irradiation time.

Figure 29A:
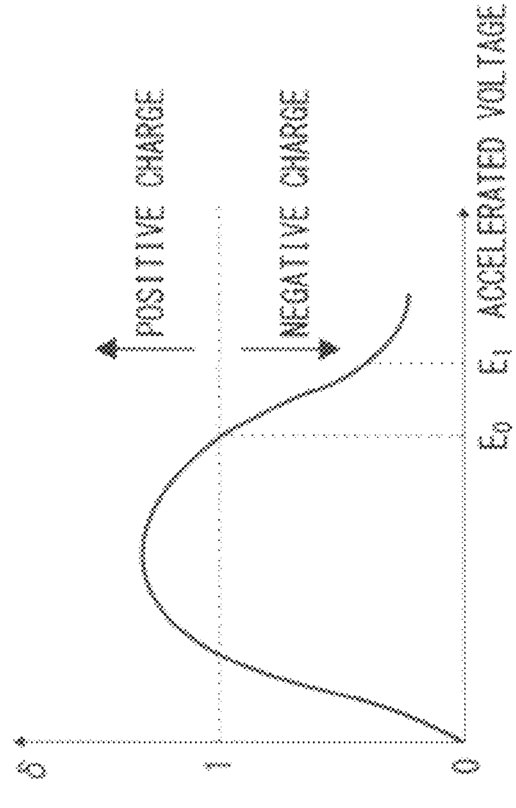
FIGS. 29A, 29B show a relation between the accelerated voltage and charging and that between the accelerated voltage and the charge potential, respectively.
Figure 29B:
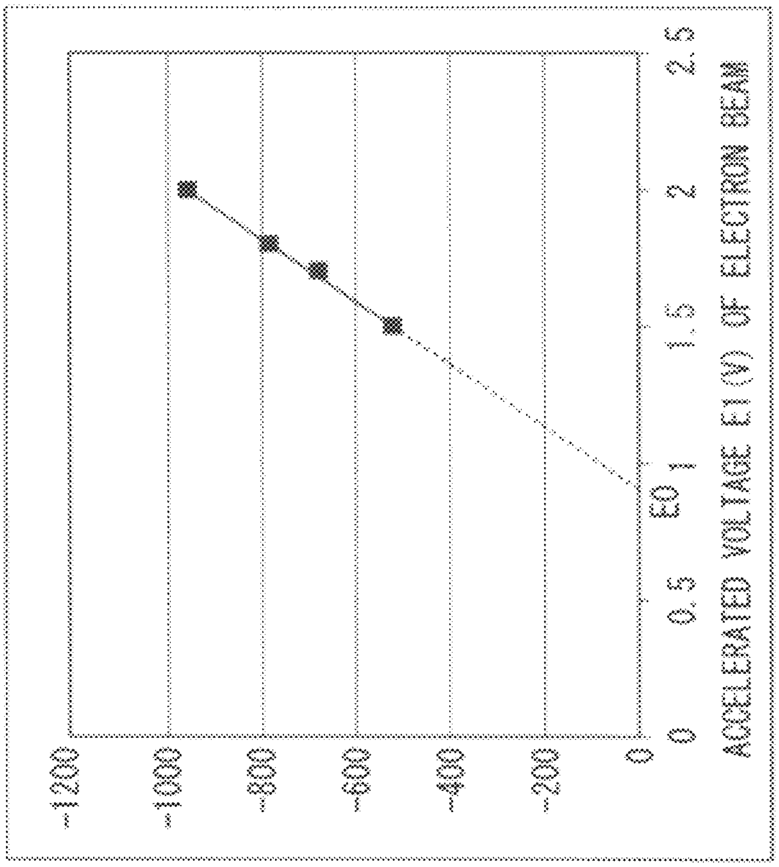

Then, the electron beam is irradiated from the electron gun 11 to the sample 23. As described above, charge up occurs on the sample as shown in FIG. 29A so that the sample can be evenly, negatively charged. There is a relation between the accelerated voltage and saturated charge potential shown in FIG. 29B. By properly controlling the accelerated voltage and light irradiation time, therefore, the charge potential as generated by an electrophotographic camera can be formed. The larger the level of probe current, the shorter the length of time in which a target charge potential is acquired. The probe current of 1 nA or more is preferable.

Then, to observe the electrostatic latent image, the amount of incident electron is reduced to 1/100 to 1/1,000 and the semiconductor laser 201 of the pattern forming unit 220 emits laser beam. The laser beam from the semiconductor laser 201 is converted by the collimate lens 203 to approximate parallel light and adjusted by the aperture 205 to be of a predetermined beam size. Then, it is focused on the sample surface through the imaging lenses 207, 209, 211. Thus, a pattern of the latent image is formed on the sample surface.

The charge on the organic photoreceptor OPC decays with time due to dark decay. Because of this, it is necessary to complete data acquirement by the signal detection within 10 seconds after the latent image generation at the latest. The surface charge distribution device 10 in FIG. 28 includes a vacuum chamber 30 in which the sample is charged and exposed. Therefore, it can start data acquirement immediately after the latent image generation and complete it within 10 seconds even when the applied voltage required for obtaining a latent image profile is changed at multiple times. By changing the applied voltage as above, it is possible to acquire latent image profile information.

An upper electrode can be additionally provided above the sample when needed. With the upper electrode, the influence of the space field occurring from the charge distribution of the sample can be localized in an area up to the upper electrode so that the structure model can be more simplified.

Moreover, the above embodiments have described an example in which the sample is a plate-like element. However, the present invention should not be limited to such an example. The sample can be a cylindrical photoreceptor, for example. Such a cylindrical photoreceptor is applicable to a photoreceptor drum used in an electrophotographic imaging device such as a laser printer, a digital copier. Accordingly, by feeding back the measurement results of the surface charge distribution for designing of the device, it is made possible to improve the quality of each process of the image generation and realize an imaging device which excels in durability and energy saving and can stably generate high-quality images.

Figure 30:
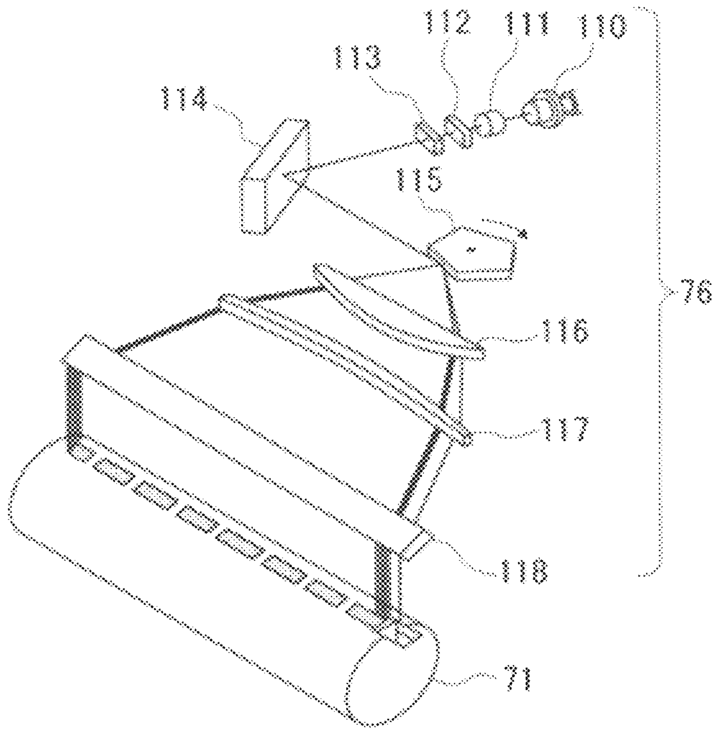
FIG. 30 is a perspective view of an example of an exposure unit applicable to the present invention.

Further, for the cylindrical photoreceptor, an exposure unit 76 shown in FIG. 30 comprises an optical scan unit including a semiconductor laser 110, a collimate lens 111, an aperture 112, a cylinder lens 113, a reflective mirror 114, a polygon mirror 115, two scan lenses 116, 117, and a reflective mirror 118 by way of example.

The semiconductor laser 110 emits laser beam for exposure. The collimate lens 111 adjusts the laser beam from the semiconductor laser 110 to approximate parallel light. The aperture 112 defines the beam size of the beam having transmitted from the collimate lens 111. By changing the size of the aperture 112, an arbitrary beam size of light within the range of 20 μm to 200 μm can be generated. The cylinder lens 113 adjusts the light from the aperture 112 to travel only in one direction. The mirror 114 bends the optical path from the cylinder lens 113 to the polygon mirror 115. The polygon mirror 115 comprises a plurality of deflection faces to deflect the light from the mirror 114 at constant angular velocity within a predetermined angular range. The two scan lenses 116, 117 convert the light deflected by the polygon mirror 115 to light at constant angular velocity. The mirror 118 bends the optical path from the scan lens 117 to a sample 71.

The operation of the exposure unit 76 is described. Light from the semiconductor laser 110 is collected near the deflection faces of the polygon mirror 115 via the collimate lens 111, aperture 112, cylinder lens 113, and reflective mirror 114. The polygon mirror 115 is rotated by a not-shown motor at a constant velocity in a direction indicated by the arrow in FIG. 31. Along with the rotation of the polygon mirror 115, the collected light is deflected at a constant angular velocity, and converted through the two scan lenses 116, 117 to scan the mirror in a longitudinal direction at constant angular velocity within a predetermined angular range. Then, reflected by the mirror 118, the light scans the surface of the sample 71. That is, optical spots move in a bus direction of the sample 71 to thereby form an arbitrary latent image pattern including a line pattern. The light source can be a multi beam scan optical system such as VCSEL.

The above embodiments have described the use of the electron beam for the charged particle beam by way of example. The present invention should not be limited thereto. Instead, ion beam is usable and by use of the ion beam, an ion gun in replace of the electron gun is used. For example, by use of a gallium (Ga) liquid metal ion gun, the accelerated voltage should be positive and the sample is applied with a bias voltage so that the surface potential becomes positive.

Further, the above embodiments have described an example in which the surface potential of the sample is negative. However, it can be positive i.e., the surface charge can be positive. In this case a positive ion beam such as gallium can be irradiated to the sample.

Further, in the seventh embodiment referring to FIG. 28, the partition 16 is placed on −Z side of the beam blanking electrode 15. However, it should not be limited thereto. It can be arbitrarily placed as long as it is between the electron gun 11 and the conductor 60.

Figure 31:
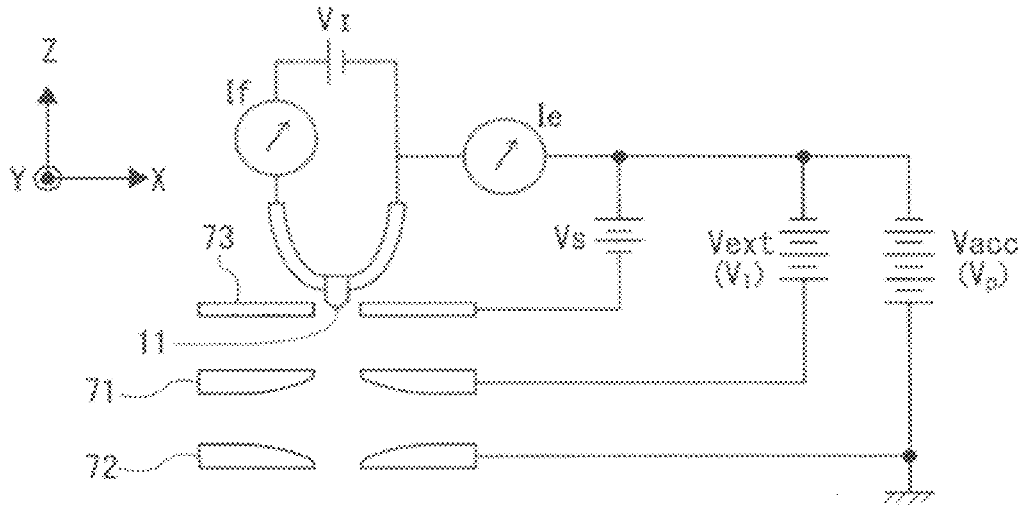
FIG. 31 shows an example of a Schottky emission electron gun.

Further, the above embodiments have described the use of a field emission electron gun for the electron gun. However, a thermionic emission electron gun or a schottky emission (SE) electron gun shown in FIG. 31 is also usable. The schottky emission electron gun in FIG. 31 comprises an emitter 11, a suppressor electrode 73, an extracting electrode 71, and an acceleration electrode 72. In FIG. 31 If is filament current, Ie is emission current and Vs is suppressor voltage. The SE electron gun is also called as thermally assisted field emission electron gun.

Further, the above embodiments have described an example where the surface charge distribution is obtained by detecting the primary inverted electron. However, the surface charge distribution can be obtained by detecting the secondary electron when there is no possibility that it is affected by the material or surface shape of a sample, for example.

As described above, the surface charge distribution measuring method and device according to any of the above embodiments can reduce the amount and number of times for the analysis based on measured values and measure the surface charge distribution of a sample such as a photoreceptor with high resolution in the order of micron and in a short length of time by deciding a structure model on the basis of a potential at the potential saddle point above the sample and an accelerated voltage of an incident charged particle to calculate the surface charge distribution of the sample according to a tentative space potential distribution associated with the structure model.

Although the present invention has been described in terms of exemplary embodiments, it is not limited thereto. It should be appreciated that variations or modifications may be made in the embodiments described by persons skilled in the art without departing from the scope of the present invention as defined by the following claims.

What is claimed is:

1. A method for measuring the surface charge distribution of a sample, comprising:

a charging step of irradiating the sample with a charged particle beam and charging a surface of the sample in a spot-like manner;

a first measuring step of irradiating the charged sample with the charged particle beam to measure a value of a potential at a potential saddle point formed above the sample;

a selecting step of selecting one structure model from preset multiple structure models and selecting a tentative space charge distribution associated with the one structure model;

a first calculating step of calculating a space potential at the potential saddle point by electromagnetic field analysis using the selected structure model and tentative space charge distribution;

a determining step of comparing the calculated space potential and the measured value to determine the tentative space charge distribution as a space charge distribution of the sample when an error between the space potential and the measured value is within a predetermined range; and a second calculating step of calculating a surface charge distribution of the sample by electromagnetic field analysis based on the determined space charge distribution of the sample.

2. The method according to claim 1, comprising:

an invoking step of invoking an evaluation function for the surface charge distribution;

a second measuring step of irradiating the sample with the charged particle beam to measure a value of a predetermined parameter to be substituted into the evaluation function;

a third calculating step of calculating a value associated with the measured value of the parameter for the surface charge distribution of the sample calculated in the second measuring step;

an evaluating step of substituting the measured value and the calculated value into the evaluation function to evaluate the surface charge distribution; and a first correcting step of correcting the surface charge distribution based on a result of the evaluating step.

3. The method according to claim 2, wherein the parameter is comprised of a plurality of parameters indicating a shape of the surface charge distribution.

4. The method according to claim 1, further comprising the step of performing the first measuring step while an acceleration voltage of the charged particle beam is fixed and an applied voltage to a back face of the sample is changed.

5. The method according to claim 2, further comprising the step of performing the second measuring step while an acceleration voltage of the charged particle beam is fixed and an applied voltage to a back face of the sample is changed.

6. The method according to claim 2, wherein:

the predetermined parameter is a diameter of an electric latent image formed on the sample; and in the third calculating step the diameter of the electric latent image is calculated from the surface charge distribution at a coordinate at which a vertical electric field intensity of the sample becomes zero.

7. The method according to claim 1, wherein in the second calculating step a coefficient matrix is determined from the space charge distribution to calculate the surface charge distribution of the sample by electromagnetic field analysis using the coefficient matrix.

8. The method according to claim 1, further comprising:

a third measuring step of irradiating the surface of the sample with the charged particle beam to find values of a voltage applied to the back face of the sample and an acceleration voltage of the charged particle beam when a landing energy of the charged particle beam reaching the surface of the sample becomes zero, the acceleration voltage being less than zero;

a fourth calculating step of subtracting the value of the applied voltage from that of the acceleration voltage to find a threshold value; and a second correcting step of correcting the surface charge distribution according to the threshold value.

9. The method according to claim 1, further comprising:

a fifth calculating step of finding, by simulation, values of a voltage applied to the back face of the sample and an acceleration voltage of the charged particle beam when a landing energy of the charged particle beam reaching the surface of the sample becomes zero, the acceleration voltage being less than zero;

a sixth calculating step of subtracting the value of the applied voltage from that of the acceleration voltage to find a threshold value; and a third correcting step of correcting the surface charge distribution according to the threshold value.

10. The method according to claim 1, further comprising:

a seventh calculating step of calculating a tentative value of charge density on an interface of the sample, the charge density forming an electromagnetic field equivalent to an electrode potential applied to a conductor;

an eighth calculating step of calculating a space field using the tentative value;

a ninth calculating step of calculating an orbit of the charged particle beam based on the calculated space field;

a fourth measuring step of irradiating the sample with the charged particle beam to measure an amount of the charged particle beam reflected by the sample;

a tenth step of calculating the amount of the charged particle beam reflected by the sample based on the orbit of the charged particle beam calculated in the ninth calculating step;

a second evaluating step of evaluating the surface charge distribution by comparing the measured value and the calculated amount of the charged particle beam; and a fourth correcting step of correcting the surface charge distribution according to a result of the second evaluating step.

11. A device for measuring the surface charge distribution of a sample, comprising:

an electric charger configured to irradiate a sample with a charged particle beam;

a detector configured to detect a boundary between an area in which the charged particle beam is inverted before reaching the sample and an area in which the charged particle beam reaches the sample;

a first measuring element configured to measure a value of potential at a potential saddle point formed above the sample;

a selector configured to select one structure model from preset multiple structure models and select a tentative space charge distribution associated with the one structure model;

a first calculator configured to calculate a space potential at the potential saddle point by electromagnetic field analysis using the selected structure model and tentative space charge distribution;

a determiner configured to compare the calculated space potential and the measured value and determine the tentative space charge distribution as a space charge distribution of the sample when an error between the space potential and the measured value is within a predetermined range; and a second calculator configured to calculate a surface charge distribution of the sample by electromagnetic field analysis based on the determined space charge distribution of the sample.

12. The device according to claim 11, further comprising:

a conductor being electrically conductive and a mount for the sample;

a voltage apply element configured to apply a voltage to the conductor;

a voltage varying element configured to vary the voltage applied by the voltage apply element;

a third calculator configured to calculate a tentative value of charge density of the sample, the charge density forming an electromagnetic field equivalent to a space potential formed by the voltage applied to the sample;

a fourth calculator configured to calculate a space field using the tentative value;

a fifth calculator configured to calculate an orbit of the charged particle beam based on the calculated space field;

a second measuring element configured to measure an amount of the charged particle beam reflected by the sample while the sample is irradiated with the charged particle beam;

a sixth calculator configured to calculate an amount of the charged particle beam reflected by the sample based on the calculated orbit of the charged particle beam by the second measuring element;

an evaluator configured to evaluate the surface charge distribution by comparing the measured amount of the charged particle beam by the second measuring element and the amount calculated by the sixth calculator; and a corrector configured to correct the surface charge distribution according to a result of the evaluation by the evaluator.

13. The device according to claim 11, further comprising:

a light source having an optical path outside an area through which the charged particle beam passes; and a light source controller configured to control a wavelength of light irradiated from the light source to be within a predetermined range and control a length of time and an amount of the light irradiation from the light source.

* * * * *